(12) United States Patent
Bang et al.

(10) Patent No.: US 12,550,766 B2
(45) Date of Patent: Feb. 10, 2026

(54) SEMICONDUCTOR DEVICE AND MANUFACTURING METHOD THEREOF

(71) Applicant: Amkor Technology Singapore Holding Pte Ltd., Singapore (SG)

(72) Inventors: Won Bae Bang, Seongnam-si (KR); Kwang Seok Oh, Seongnam-si (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 18/594,792

(22) Filed: Mar. 4, 2024

(65) Prior Publication Data

US 2024/0363506 A1    Oct. 31, 2024

Related U.S. Application Data

(63) Continuation of application No. 17/464,961, filed on Sep. 2, 2021, now Pat. No. 11,923,280, which is a
(Continued)

(51) Int. Cl.
*H01L 23/498*    (2006.01)
*H01L 21/56*    (2006.01)
(Continued)

(52) U.S. Cl.
CPC ...... *H01L 23/49805* (2013.01); *H01L 21/561* (2013.01); *H01L 23/49827* (2013.01);
(Continued)

(58) Field of Classification Search
CPC ............ H01L 23/49805; H01L 21/561; H01L 23/49827; H01L 23/49861; H01L 23/145; H01L 23/147; H01L 23/3128; H01L 23/49811; H01L 23/562; H01L 2224/16227; H01L 2224/16235; H01L 2224/97; H01L 2924/15311;
(Continued)

(56) References Cited

U.S. PATENT DOCUMENTS 5,586,011 A    12/1996    Alexander
8,084,300 B1    12/2011    San Antonio et al.
(Continued)

FOREIGN PATENT DOCUMENTS

CN    101339939    1/2009
CN    102339817    2/2012
(Continued)

OTHER PUBLICATIONS

Taiwanese Office Action for Application No. 105110730, search completed Mar. 31, 2020, 12 pages.
(Continued)

*Primary Examiner* — Cuong B Nguyen
(74) *Attorney, Agent, or Firm* — McAndrews, Held & Malloy, Ltd.

(57) ABSTRACT

A thin semiconductor device with enhanced edge protection, and a method of manufacturing thereof. For example and without limitation, various aspects of this disclosure provide a thin semiconductor device comprising a substrate with an edge-protection region, and a method of manufacturing thereof.

20 Claims, 15 Drawing Sheets

Related U.S. Application Data continuation of application No. 16/456,884, filed on Jun. 28, 2019, now Pat. No. 11,114,369, which is a continuation of application No. 15/069,416, filed on Mar. 14, 2016, now Pat. No. 10,340,213.

(51) Int. Cl.
   *H01L 23/00* (2006.01)
   *H01L 23/14* (2006.01)
   *H01L 23/31* (2006.01)

(52) U.S. Cl.
   CPC ...... *H01L 23/49861* (2013.01); *H01L 23/145* (2013.01); *H01L 23/147* (2013.01); *H01L 23/3128* (2013.01); *H01L 23/49811* (2013.01); *H01L 23/562* (2013.01); *H01L 2224/16227* (2013.01); *H01L 2224/16235* (2013.01); *H01L 2224/97* (2013.01); *H01L 2924/15311* (2013.01)

(58) Field of Classification Search
   CPC . H01L 23/3121; H01L 23/481; H01L 23/488; H01L 21/78; H01L 23/49838; H01L 24/16; H01L 23/49816; H01L 24/97
   See application file for complete search history.

(56) References Cited

U.S. PATENT DOCUMENTS

| | | |
|---|---|---|
| 2002/0168798 A1 | 11/2002 | Glenn et al. |
| 2005/0263873 A1 | 12/2005 | Shoji |
| 2006/0091542 A1* | 5/2006 | Zhao ............... H01L 23/36 257/E23.101 |
| 2010/0032815 A1* | 2/2010 | An ............... H01L 23/3121 257/E23.114 |
| 2010/0207259 A1 | 8/2010 | Liao et al. |
| 2011/0159638 A1 | 6/2011 | Wang |
| 2012/0015687 A1 | 1/2012 | Yamada et al. |
| 2012/0286407 A1 | 11/2012 | Choi et al. |
| 2013/0099393 A1 | 4/2013 | Jeong et al. |
| 2014/0322866 A1 | 10/2014 | Chen et al. |
| 2015/0187743 A1 | 7/2015 | Yu et al. |

FOREIGN PATENT DOCUMENTS

| | | |
|---|---|---|
| CN | 206619592 | 11/2017 |
| JP | 2015141904 | 8/2015 |
| JP | 2015233164 | 12/2015 |
| KR | 10-2007-0099356 | 10/2007 |
| TW | 201101452 | 1/2011 |
| TW | 201214651 | 4/2012 |
| TW | I378765 | 12/2012 |
| TW | 201327745 | 7/2013 |
| TW | I452666 | 9/2014 |
| TW | 201633456 | 9/2016 |

OTHER PUBLICATIONS

Taiwanese Office Letter and Search Report for Application No. 109139770, search completed Dec. 28, 2021, 19 pages.
Chinese Office Action for Application No. 201710149951.9, issued May 9, 2022, 21 pages.
Chinese Office Action for Application No. 201710149951.9, issued Dec. 2, 2022, 20 pages.
Korean Office Action for Application No. 10-2016-0065938, issued Mar. 12, 2023, 8 pages.
Taiwanese Office Actions for Application No. 111131530, dated Dec. 20, 2023, 22 pages.
Korean Office Action for Application No. 10-2024-0049142, dated May 3, 2024, 18 pages.
Korean Office Action for Application No. 10-2024-0049142, dated Jan. 22, 2025, 6 pages with English translation.
Taiwanese Office Action for Application No. 113129605, completed Jun. 10, 2025, 13 pages with English translation.

* cited by examiner

SEMICONDUCTOR DEVICE AND MANUFACTURING METHOD THEREOF

RELATED APPLICATIONS

The present application is a continuation of U.S. application Ser. No. 17/464,961 filed Sep. 2, 2021, which is a continuation of U.S. application Ser. No. 16/456,884, filed Jun. 28, 2019, now U.S. Pat. No. 11,114,369, which is a continuation of U.S. application Ser. No. 15/069,416, filed Mar. 14, 2016, now U.S. Pat. No. 10,340,213, the disclosures of which are incorporated herein in their entireties.

BACKGROUND

Present semiconductor devices, and methods of manufacturing thereof, are inadequate, for example resulting in thin packages that may be subject to fracturing at the edges. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
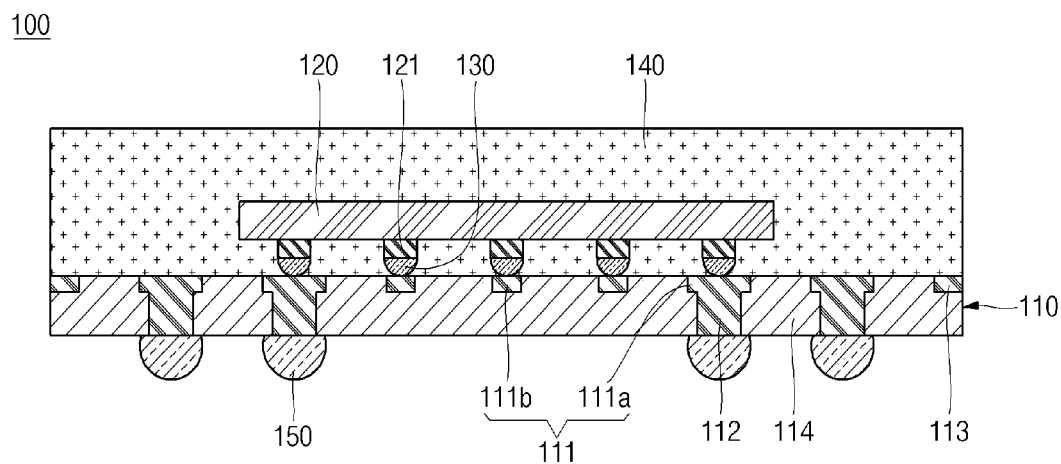
FIG. 1 is a cross-sectional view illustrating an example semiconductor device in accordance with various aspects of the present disclosure.

Various aspects of this disclosure provide a thin semiconductor device with enhanced edge protection, and a method of manufacturing thereof. For example and without limitation, various aspects of this disclosure provide a thin semiconductor device comprising a substrate with an edge-protection region, and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

Also, as utilized herein, the term "on" means both "on" and "directly on" (e.g., with no intervening layer). Also, the term "over" means both "over" and "directly over" and the term "above" means both "above" and "directly above." Further, the term "under" means both "under" and "directly under," and the term "below" means both "below" and "directly below." Additionally, the term "between" will be utilized in the document to mean both "between" and "the only item between."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, various dimensions (e.g., layer thickness, width, etc.) may be exaggerated for illustrative clarity. Additionally, like reference numbers are utilized to refer to like elements throughout the discussions of various examples.

In accordance with various aspects of this disclosure, semiconductor devices may be formed comprising a substrate, which in turn is formed of a metal pattern (e.g., copper, etc.) that is surrounded by a dielectric material (e.g., a mold material, etc.). The metal pattern may, for example, comprise an edge pattern portion that protects the edges of the dielectric material and may also provide electromagnetic interference (EMI) protection for the substrate.

Various aspects of this disclosure, for example, provide a semiconductor device that includes a substrate having a first substrate side, a second substrate side opposite the first substrate side, and a plurality of perimeter substrate sides extending between the first substrate side and the second substrate side. The substrate may also include a first conductive layer at the first substrate side that comprises a central pattern at the first substrate side and a first edge pattern at the first substrate side and at the perimeter substrate sides. The substrate may also include a second conductive layer at the second substrate side and electrically connected to the first conductive layer. The first conductive layer and the second conductive layer may, for example, be directly formed on each other. The semiconductor device may further include a semiconductor die comprising a first die side, a second die side opposite the first die side and coupled to the first substrate side, and a plurality of perimeter die sides extending between the first die side and the second die side. The semiconductor device may also include a conductive interconnection structure electrically connecting the semiconductor die to the central pattern, and an encapsulant on the first substrate side and covering at least the perimeter die sides. Various aspects of this disclosure also provide a method for making such semiconductor device.

Various aspects of this disclosure, for example, provide a semiconductor device that includes a substrate having a first substrate side, a second substrate side opposite the first substrate side, and a plurality of perimeter substrate sides extending between the first substrate side and the second substrate side. The substrate may also include a central pattern exposed at the first substrate side, a plurality of conductive vias connected to the central pattern and exposed at the second substrate side, and an edge pattern exposed at the perimeter substrate sides and surrounding the substrate. The semiconductor device may also include a semiconductor die coupled to the first substrate side. Various aspects of this disclosure also provide a method for making such semiconductor device.

Various aspects of this disclosure, for example, provide a semiconductor device that includes a substrate having a first substrate side, a second substrate side opposite the first substrate side, and a plurality of perimeter substrate sides extending between the first substrate side and the second substrate side. The substrate may also include a first conductive layer at the first substrate side and including a central pattern at the first substrate side, and a first portion of an edge pattern at the first substrate side and at the perimeter substrate sides. The substrate may additionally include a second conductive layer at the second substrate side and including a conductive via at the second substrate side and connected to the central pattern, and a second portion of the edge pattern at the second substrate side and at the perimeter substrate sides and connected to the first portion of the edge pattern. The semiconductor device may further include a semiconductor die coupled to the first substrate side. Various aspects of this disclosure also provide a method for making such semiconductor device.

Various aspects of this disclosure provide a semiconductor device that includes a substrate having a pattern region formed at a first surface thereof and a through region connected to the pattern region and extended to a second surface opposite to the first surface. The substrate may also include an edge region made of a metal, which is formed along the circumference of a plurality of side surfaces positioned between the first surface and the second surface of the substrate. The semiconductor device may also include a semiconductor die formed above the first surface of the substrate, a conductive connection member electrically connecting the substrate and the semiconductor die to each other, and one or more encapsulating materials formed on the first surface of the substrate and surrounding the semiconductor die and the conductive connection member. Various aspects of this disclosure also provide a method for making such semiconductor device.

The edge region may, for example, be integrally formed (e.g., in a continuous band or strip) along the circumference of the side surfaces of the substrate, or may be formed with a plurality of patterns arranged along the circumference of the side surfaces of the substrate. The edge region may, for example, be formed with the same thickness as the pattern region of the substrate. The edge region may, for example, extend in a thickness direction of the substrate. The edge region may, for example, include a first region having the same thickness as the pattern region and a second region extended in a direction passing through the thickness of the substrate from the first region. The width of the first region may, for example, be different from that of the second region. The edge region may, for example, be further exposed at the first and/or second surfaces of the substrate. The edge region may, for example, be exposed at the entire side surfaces of the substrate. The edge region may, for example, be coupled to one or more ground terminals of the semiconductor device.

The semiconductor device may further include one or more connection regions extended from the edge region to the pattern region. The connection region may, for example, have the same thickness as the pattern region. The connection region may, for example, extend toward the pattern region from a portion (e.g., an interior side) of the edge region. The semiconductor device may, for example, be connected to provide a ground or reference signal to the edge region via the connection region.

Various aspects of this disclosure provide a semiconductor device that includes a substrate including a pattern region formed at a first surface thereof and a through region connected to the pattern region and extended to a second surface opposite to the first surface. The semiconductor device may also include a semiconductor die formed above the first surface of the substrate, a conductive connection member electrically connecting the substrate and the semiconductor die to each other, and an encapsulant formed on the first surface of the substrate to surround the semiconductor die and the conductive connection member. The substrate may, for example, further include an edge region formed along the circumference of a side surface positioned between the first surface and the second surface, where edge region is connected to a ground or reference signal terminal. Various aspects of this disclosure also provide a method for making such semiconductor device.

Various aspects of this disclosure provide a method of fabricating a semiconductor device, where the method includes forming a pattern region on one surface of a carrier and a sawing region corresponding to a line to be sawed, forming a conductive through region protruded from at least one portion of the pattern region, forming a molding region on the one surface of the carrier forming a substrate (or panel thereof) by removing the carrier, bonding a semiconductor die to one surface of the substrate, forming an encapsulant to surround the semiconductor die, and splitting the substrate and encapsulant by sawing (or otherwise singulating) along the sawing line. Various aspects of this disclosure also provide a semiconductor device resulting from such method, for example at various stages of the method and/or upon completion of the method.

The sawing region may, for example, be formed of the same metal as the pattern region. The sawing region may, for example, be formed with the same height (e.g., above the carrier) as the pattern region or may be formed with the same height as the through region. The sawing region may, for example, include a first region having the same height as the pattern region and a second region protruding from the first region. The width of the first region may, for example, be different from that of the second region. The sawing may, for example, be performed along the center of the sawing region. A connection region extended from the sawing region to the pattern region may also be formed.

Various example aspects of the present disclosure will now be presented in the context of the accompanying drawings.

FIG. 1 is a cross-sectional view illustrating an example semiconductor device in accordance with various aspects of the present disclosure.

The example semiconductor device 100 may, for example, comprise a substrate 110, a semiconductor die 120, a conductive connection member 130, an encapsulant 140, and a conductive ball 150.

The example substrate 110 may, for example, comprise a first substrate side (e.g., a top side), a second substrate side (e.g., a bottom side) opposite the first substrate side, and a plurality of perimeter substrate sides (e.g., lateral sides) extending between the first substrate side and the second substrate side.

The example substrate 110 may, for example, comprise a central pattern 111 (e.g., a conductive pattern) at the first substrate side. The central pattern 111 may also be referred to herein as a pattern region 111. For example, the central pattern 111 (e.g., a first or top side thereof) may be exposed at the first substrate side. The first (or top) side of the central pattern 111 may, for example, be coplanar with the first substrate side, but may also in various example implementations extend from and/or be recessed in the first substrate side. As discussed herein, various sides of the central pattern 111 (e.g., lateral sides, all or at least a portion of a bottom side, etc.) may be covered by the dielectric material or dielectric layer 114, while the first side (e.g., top side) of the central pattern 111 is exposed from the dielectric layer 114.

The central pattern 111 may, for example, comprise a conductive layer (e.g., a metal layer, a copper layer, etc.) or a portion thereof. The semiconductor die 120 may, for example, be mounted to the substrate 110 over the central pattern 111 and electrically connected to the central pattern 111.

The example substrate 110 may, for example, comprise a conductive via 112 at the second substrate side. The conductive via 112 may also be referred to herein as a through portion 112. For example, the conductive via 112 (e.g., a second or bottom side thereof) may be exposed at the second substrate side. The second (or bottom) side of the conductive via 112 may, for example, be coplanar with the second substrate side, but may also in various example implementations extend from and/or be recessed in the second substrate side. As discussed herein, various sides of the conductive via 112 (e.g., lateral sides, all or at least a portion of a top side, etc.) may be covered by the dielectric layer 114, while the second side (e.g., bottom side) of the conductive via 112 is exposed from the dielectric layer 114.

The conductive via 112 may, for example, comprise a conductive layer (e.g., a metal layer, a copper layer, etc.) or a portion thereof. The conductive via 112 may, for example, comprise a conductive path extending through the substrate 110. In an example implementation, the conductive via 112 may connect to the central pattern 111 and extend directly from the central pattern 111 to the second substrate side. Though the example conductive via 112 is shown extending straight through the substrate 110 with straight sides, the conductive via 112 (or one or more portions thereof) may also extend laterally (e.g., in a direction generally parallel to the first and second substrate sides). Note that, as shown in FIG. 1, the substrate 110 may generally comprise a plurality of the conductive vias 112.

The central pattern 111 may, for example, comprise a first portion 111a to which the conductive via(s) 112 are connected (e.g., beneath the first portion 111a), and a second portion 111b to which the conductive via(s) 112 are not connected.

The example substrate 110 may, for example, comprise an edge pattern 113 (e.g., a conductive edge pattern) at the peripheral substrate sides. Various example configurations of the edge pattern 113 are presented herein. In FIG. 1, the edge pattern 113 is exposed at the first substrate side around the entire periphery of the first substrate side. Also, the edge pattern 113 is exposed at the peripheral substrate sides around the entire periphery of the substrate 110. Note that in various example implementations, the edge pattern 113 may be segmented (e.g., into a plurality of metal patterns with gaps in between) around the periphery rather than being continuous (e.g., configured as a single band or trace). The edge pattern 113 may, for example, comprise a conductive layer (e.g., a metal layer, copper layer, etc.) or a portion thereof.

In an example implementation, the central pattern 111 may comprise a first portion of a first conductive layer, and the edge pattern 113 may comprise a second portion of the first conductive layer. In the example implementation, the conductive via(s) 112 may comprise a second conductive layer formed in a different processing operation than the first conductive layer. Note however, that such different processing operations may be the same type of processing operation, and the first and second conductive layers may comprise the same material even if formed in separate processing operations.

Note that the edge pattern 113 may be spaced apart from and/or electrically isolated from the central pattern 111, but need not be. As presented in various example implementations, the edge pattern 113 may be electrically connected to the central pattern 111. The edge pattern 113 may, for example, be grounded (or otherwise coupled to a reference voltage). Such grounding may, for example, provide electromagnetic interference (EMI) shielding. Additionally, as discussed herein, the edge pattern 113 may provide protection for the substrate 110 in a sawing or other singulation process, for example preventing or reducing the occurrence of cracks formed during singulation.

The example substrate 110 may, for example, comprise a dielectric layer 114. The dielectric layer 114 may also be referred to herein as a molding structure or a molding region 114. The dielectric layer 114 may comprise any of a variety of characteristics, non-limiting examples of which are provided herein. The dielectric layer 114 may, for example, comprise one or more layers of any of a variety of molding materials (e.g., resin, polymer, polymer composite material (such as epoxy resin with filler, epoxy acrylate with filler, or polymer with a filler), etc.). Also for example, the dielectric 114 may comprise one or more layers of any of a variety of dielectric materials, for example inorganic dielectric material (e.g., $Si_3N_4$, $SiO_2$, SiON, etc.) and/or organic dielectric material (e.g., polyimide (PI), benzocyclobutene (BCB), polybenzoxazole (PBO), bismaleimide triazine (BT), a phenolic resin, epoxy, etc.). In the example device 100 shown in FIG. 1, the dielectric layer 114 comprises only a single continuous layer of molding resin or mold compound.

The dielectric layer 114 may, for example, cover lateral sides (or surfaces) of the central pattern 111 and the conductive via(s) 112. The dielectric layer 114 may also, for example, cover at least a portion of the lateral sides of the edge pattern 113. In an example implementation, the dielectric layer 114 may cover lateral sides of the edge pattern 113 that face toward the interior of the substrate 110, leaving the lateral sides of the edge pattern 113 that face outward from the substrate 110 exposed. The dielectric layer 114 may, for example, hold the various components of the substrate 110 together and provide for electrical isolation internally between various conductors.

The example device 100 may comprise a semiconductor die 120 coupled to the first side (e.g., top side) of the substrate 110. The semiconductor die 120 may comprise any of a variety of types of integrated circuit chips (e.g., general purpose processors, digital signal processors, audio and/or video processors, memory devices, power management units, network processors, radio frequency circuits, wireless baseband systems, sensors, application specific integrated circuits, etc.).

The semiconductor die 120 may, for example, comprise a first die side (e.g., a top side), a second die side (e.g., a bottom side), and a plurality of peripheral (or lateral) die sides extending between the first side and the second side. The semiconductor die 120 may comprise a conductive member 121 (or a plurality thereof) formed on the second die side for inputting and/or outputting electrical signals. The conductive member 121 may, for example, comprise any of a variety of conductive materials (e.g. aluminum, copper, silver, gold, titanium, nickel, chromium, tungsten, alloys thereof, etc.). The conductive member 121 may, for example, be exposed through a dielectric layer (e.g., a passivation layer) formed on the second die side of the die 120. Such a dielectric layer may, for example, protect underlying semiconductor material (e.g., silicon, etc.) of the die 120. Such a second die side of the semiconductor die 120 may, for example, comprise an active side of the die 120.

The conductive member 121 may comprise any of a variety of physical characteristics. For example, the conductive member 121 may comprise a conductive pad (e.g., a bond pad, etc.), a conductive pillar (or post) or wire, a conductive structure, etc.

The conductive member 121 may, for example, be mechanically and/or electrically connected to the central pattern 111 utilizing any of a variety of types of connection. For example, the connection may comprise a direct metal-to-metal bond (e.g., Cu-to-Cu bond, etc.), solder bond, epoxy bond, etc. In an example implementation, a conductive connection member 130 may be utilized to provide the connection between the conductive member(s) 121 and the central pattern 111. The conductive connection member 130 may comprise any of a variety of characteristics. For example, the conductive connection member 130 may comprise solder (e.g., a solder cap or tip on the conductive member 121, a reflowed portion of the conductive member 121, a reflowed solder paste, etc.). Also for example, the conductive connection member 130 may comprise a conductive bump (e.g., a die bump, a wafer bump, a solder cap, etc.) and/or a reflowable portion thereof. The conductive connection member 130 may also comprise copper pillar wafer bumps which may comprise a copper pillar that may have a solder cap or solder tip formed on the copper pillar. The conductive connection member 130 may comprise any one or more of a variety of materials (e.g., solder, tin, copper, silver, lead, epoxy, etc.).

Though not explicitly shown in FIG. 1, in a flip-chip configuration in which the front or active side of the semiconductor die 120 faces and is attached to the substrate 110, an underfill material that is distinct from the encapsulating material 140 may be formed between the semiconductor die 120 and the substrate 110 (e.g., surrounding the conductive connection member(s) 130, etc.). Such an underfill material may comprise a capillary underfill, a pre-applied underfill, a non-conductive paste, etc. As shown in FIG. 1, a molded underfill material may be formed, for example during a molding process that forms the encapsulant 140 discussed herein.

In a semiconductor device configuration in which the back or inactive side of the semiconductor die 120 is attached to the substrate 110, the conductive connection member 130 may comprise a wirebond wire (e.g., gold, silver, copper, aluminum, alloys thereof, etc.) extending between the conductive member 121 of the die 120 and the conductive pattern 111. In such a configuration, the semiconductor die 120 may be mechanically coupled to the substrate 110 using an adhesive (e.g., a die attach film, a paste, a liquid, etc.).

The example semiconductor device 100 may, for example, comprise an encapsulant 140 on the substrate 110 and the semiconductor die 120. The encapsulant 140 may, for example, cover a portion of or all of the first (or top) substrate side, the peripheral or lateral die sides of the semiconductor die 120, the first (or top) die side of the semiconductor die 120, the second (or bottom) die side of the semiconductor die 120, side surfaces of the conductive member(s) 121, side surfaces of the conductive connection member(s) 130, etc.

The encapsulant 140 may comprise characteristics of any of a variety of materials. For example, the encapsulant 140 may comprise one or more of resin, polymer, polymer composite material (such as epoxy resin with filler, epoxy acrylate with filler, or polymer with a filler), etc. Also for example, the encapsulant 140 may be a mold compound or may comprise one or more of any of the organic and/or inorganic dielectric materials discussed herein. The encapsulant 140 may, for example, protect various components of the semiconductor device 100 from external conditions. Note that although the encapsulant 140 is shown covering a first die side (e.g., a top side) of the semiconductor die 120, such die side may alternatively be exposed from the encapsulant 140. For example, a top surface of the encapsulant 140 may be coplanar with a top surface of the semiconductor die 120, the top surface of the semiconductor die 120 may be exposed through an aperture in the encapsulant 140, etc.

The example semiconductor device 100 may comprise a conductive interconnection structure 150, or a plurality thereof. In general, the conductive interconnection structure(s) 150 may be utilized to electrically and/or mechanically attach the example semiconductor device 100 to another part (e.g., to another electronic device, to a packaging substrate of a multi-device package, to a motherboard, etc.). The conductive interconnection structure(s) 150, for example, provide a path through which electric signals (e.g., digital signals, analog signals, electrical power signals, etc.) may be communicated to and/or from the device 100.

The conductive interconnection structure 150 (e.g., a package interconnection structure, etc.) may comprise characteristics of any of a variety of types of conductive interconnection structures (e.g., conductive balls, solder balls, conductive bumps, solder bumps, wires, leads, pads, land grid array (LGA) lands, etc.). For example, the example device 100 shown in FIG. 1 comprises a ball grid array (BGA) configuration in which the conductive interconnection structures 150 comprise conductive balls 150 arranged in a multi-dimensional array. In another example implementation, the conductive interconnection structures 150 comprise bare lands in a land grid array (LGA) configuration. The conductive interconnection structure 150 may comprise any of a variety of materials (e.g., tin, copper, silver, lead, alloys thereof, etc.).

In the example shown in FIG. 1, the conductive interconnection structure 150 comprises a conductive ball 150 that is bonded to a portion of the conductive via 112 exposed at the second side of the substrate 110. As explained herein, the conductive ball 150 may be bonded to the conductive via 112 directly with no intervening metals, may be bonded to under bump metallization formed on the conductive via 112, etc. Accordingly, the through region 112 can be electrically connected to the conductive ball 150.

Figure 2:
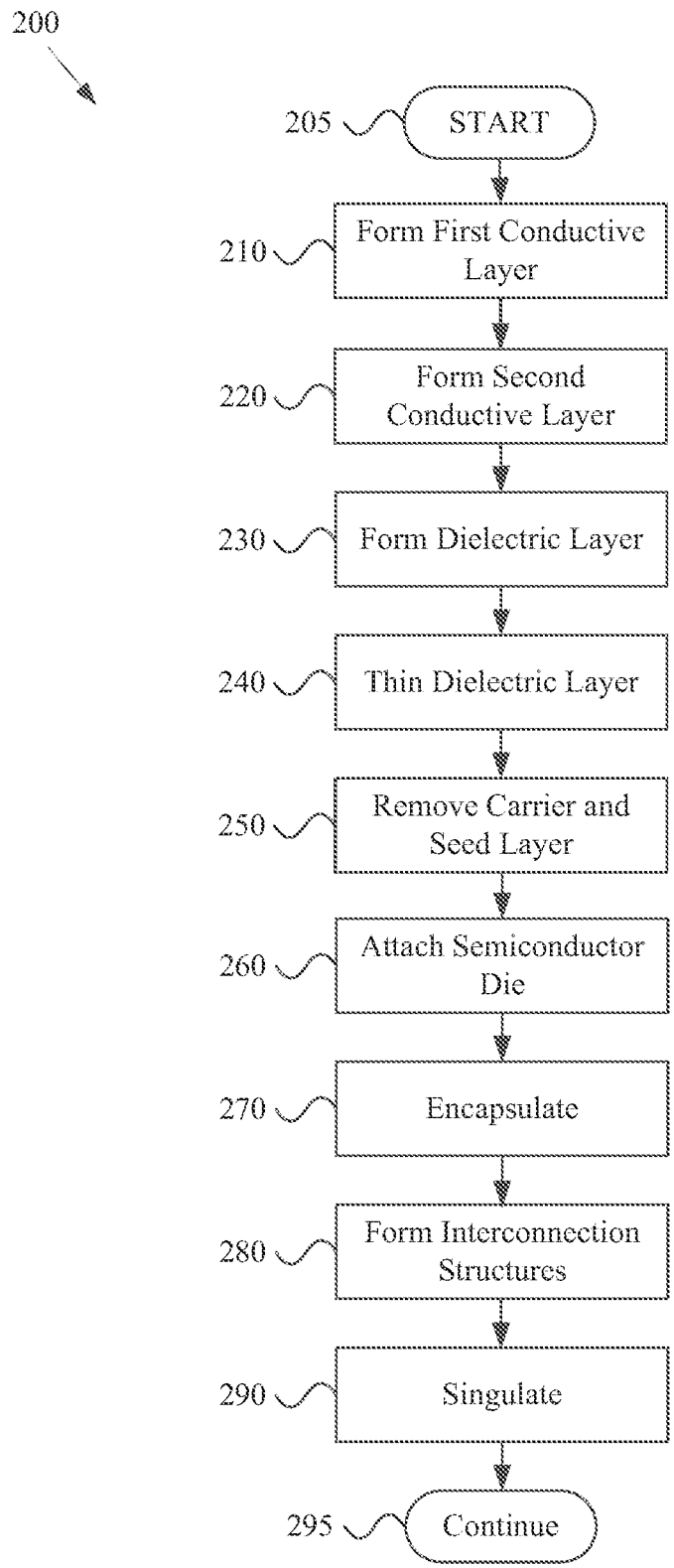
FIG. 2 is a flow diagram illustrating an example method of manufacturing the example semiconductor device of FIG. 1.

FIG. 2 is a flow diagram illustrating an example method 200 of manufacturing the example semiconductor device 100 of FIG. 1. FIGS. 3A to 3K are cross-sectional views illustrating various aspects of the example method 200 shown in FIG. 2. The discussion will now refer to at least FIG. 2 and FIGS. 3A to 3K together.

The example method 200 may, at block 210, comprise forming a first conductive layer. An example of such forming is provided at FIG. 3A. A seed layer 11 is formed on a top surface of a carrier 10. The carrier 10 may comprise any of a variety of characteristics. For example, the carrier 10 may be shaped as a rectangular plate or panel, strip-shaped to accommodate a one-dimensional array of semiconductor devices, multi-dimensional array-shaped to accommodate a multi-dimensional array of semiconductor devices, shaped as a circular wafer, etc. The carrier 10 may comprise any of a variety of materials. For example, the carrier 10 may comprise metal, glass, semiconductor material, etc. The seed layer 11 may comprise any of a variety of materials (e.g., copper, silver, gold, aluminum, tungsten, titanium, nickel, molybdenum, etc.). The seed layer 11 may be applied utilizing any of a variety of techniques (e.g., sputtering or other physical vapor deposition (PVD) technique, chemical vapor deposition (CVD), electroless plating, electrolytic plating, etc.).

After applying the seed layer 11, a first conductive layer may be patterned on the seed layer 11. For example, a temporary mask (not shown) may be formed on portions of the seed layer 11 on which the first conductive layer is not to be formed, and the first conductive layer may then be formed (e.g., by electroplating) on the areas of the seed layer 11 exposed by the mask. The first conductive layer may comprise any of a variety of conductive materials (e.g., copper, silver, gold, nickel, aluminum, titanium, tungsten, chromium, alloys thereof, etc.). The temporary mask may be formed by using a photoresist material and photolithography processes.

Note that the first conductive layer may be formed by processes other than electroplating. For example, the first conductive layer may be formed by electroless plating, chemical vapor deposition (CVD), sputtering or physical vapor deposition (PVD), plasma vapor deposition, printing, etc. In such examples, the seed layer 11 may or may not be formed.

The first conductive layer may, for example, form the central pattern 111 (e.g., the first portion 111a and second portion 111b, as discussed herein) and the edge pattern 113. For example, the first conductive layer may be formed in a sawing region 113' that, upon sawing, will result in the edge pattern 113. The sawing region 113', so formed, may for example be in the shape of one or more parallel and/or perpendicular bands, examples of which are provided herein.

Note that the central pattern 111 and the edge pattern 113 (e.g., formed in sawing region 113' at this point) may be formed simultaneously, for example in a same plating operation or other manner of forming. This, however, need not be the case. For example, the central pattern 111 and the edge pattern 113 may be formed in separate masking/plating operations, may be formed utilizing different types of forming processes, different materials, etc.

The example method 200 may, at block 220, comprise forming a second conductive layer. An example of such forming is provided at FIG. 3B. A second conductive layer may be patterned on the first conductive layer (or portions thereof) formed at block 210. For example, the second conductive layer may be formed on the first portion 111a of the conductive pattern 111 (or on portions thereof), but might not be formed on the second portion 111b of the conductive pattern 111. Though not shown in the example of FIG. 2 and FIGS. 3A-3K, as presented elsewhere herein, the second conductive layer may also be formed on the first conductive layer (or portions thereof) at the saw lines 113'.

For example, a temporary mask (not shown) may be formed on portions of the first conductive layer formed at block 210. For example, a temporary mask may be formed on the first conductive layer at the saw lines 113', on the second portion 111b of the conductive pattern 111, and on parts of the first portion 111a of the conductive pattern 111 on which the second conductive layer is not to be formed, and the second conductive layer may then be formed (e.g., by electroplating) on the areas of the first conductive layer exposed by the mask. The second conductive layer may comprise any of a variety of conductive materials (e.g., copper, silver, gold, nickel, aluminum, titanium, tungsten, chromium, alloys thereof, etc.). The second conductive layer may, for example, comprise or consist of the same material as the first conductive layer.

The second conductive layer may also, for example, be formed utilizing a same type of process as used for formation of the first conductive layer, but this need not be the case. For example, the second conductive layer may be formed by electroplating electroless plating, chemical vapor deposition (CVD), sputtering or physical vapor deposition (PVD), plasma vapor deposition, printing, etc.

The second conductive layer may, for example, form the conductive via 112 (or plurality thereof). For example, the conductive via 112 may be formed directly on the first portion 111a of the central pattern 111 (e.g., without an intervening layer), but other metal layers may also intervene between the conductive via 112 and the first portion 111a of the central pattern. In the examples shown in FIGS. 1, 2, and 3A to 3K, the width (e.g., lateral or horizontal width) of the first portion 111a of the central pattern 111 is greater than the width of the conductive via 112. This need not be the case, however. For example, the width of the first portion 111a and the conductive via 112 may be the same, or the width of the first portion 111a may be less than the width of the conductive via 112.

Additionally, in the examples shown in FIGS. 1, 2, and 3A to 3K, the thickness (e.g., vertical thickness) of the second conductive layer (and thus the conductive via 112) may be greater than the thickness of the first conductive layer (and thus the first portion 111a of the central pattern 111). This need not be the case, however. For example, the thickness of the second conductive layer may be less than, or the same as, the thickness of the first conductive layer.

Note that though the example presented herein generally shows the formation of two conductive layers (e.g., at blocks 210 and 220), the scope of this disclosure is not limited thereto. For example, any number of such conductive layers may be formed (e.g., one, three, etc.).

The example method 200 may, at block 230, comprise forming a dielectric layer. An example of such forming is provided at FIG. 3C. The dielectric layer 114 may also be referred to herein as a molding layer.

The dielectric 114 may comprise any of a variety of characteristics, non-limiting examples of which are provided herein. For example, the dielectric 114 may comprise one or more layers of any of a variety of molding materials (e.g., resin, polymer, polymer composite material (such as epoxy resin with filler, epoxy acrylate with filler, or polymer with a filler), etc.). Also for example, the dielectric 114 may comprise one or more layers of any of a variety of dielectric materials, for example inorganic dielectric material (e.g., $Si_3N_4$, $SiO_2$, SiON, etc.) and/or organic dielectric material (e.g., polyimide (PI), benzocyclobutene (BCB), polybenzoxazole (PBO), bismaleimide triazine (BT), a phenolic resin, epoxy, etc.). In the example implementations shown in FIGS. 1, 2, and 3A to 3K, the dielectric layer comprises only a single continuous layer of molding resin.

The dielectric layer 114 may, for example, cover lateral sides (or surfaces) of the central pattern 111 and the conductive via(s) 112. The dielectric layer 114 may also, for example, cover at least a portion of the lateral sides of the edge pattern 113. In an example implementation, the dielectric layer 114 may cover lateral sides of the edge pattern 113 that face toward the interior of the substrate 110, leaving the lateral sides of the edge pattern 113 that face outward from the substrate 110 exposed. The dielectric layer 114 may also cover upper surfaces (e.g., in the orientation shown in FIG. 3C) of the seed layer 11, the central pattern 111, the conductor formed in the sawing region 113', the conductive via(s) 112, the carrier 10, etc. In the example shown in FIG. 3C, the dielectric layer 114 is formed with a flat uniform upper surface that is parallel to an upper surface of the carrier 10 and that has a height above the carrier 10 that is greater than the height of the conductive via(s) 112 above the carrier (e.g., thus completely covering the conductive via(s) 112). The dielectric layer 114 may, for example, hold the various components of the substrate 110 together and provide for internal electrical isolation between various conductors.

Figure 3A:
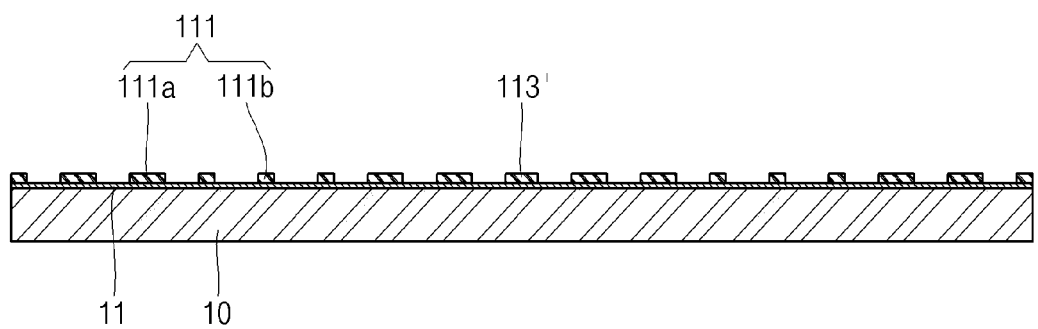
FIGS. 3A to 3K are cross-sectional views illustrating various aspects of the example method shown in FIG. 2.
Figure 3B:
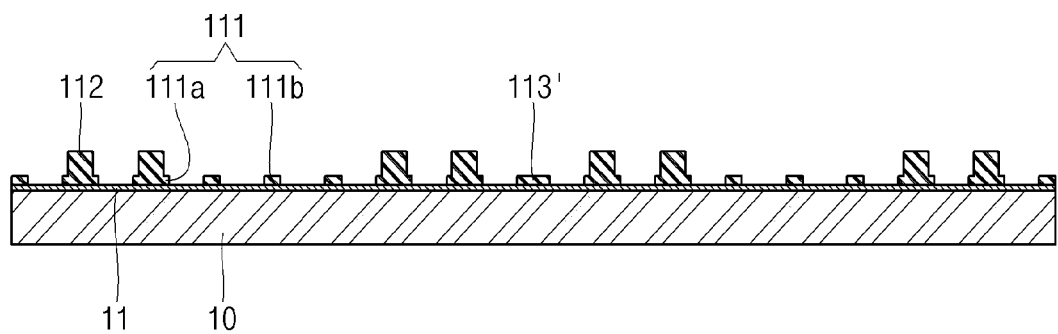
Figure 3C:
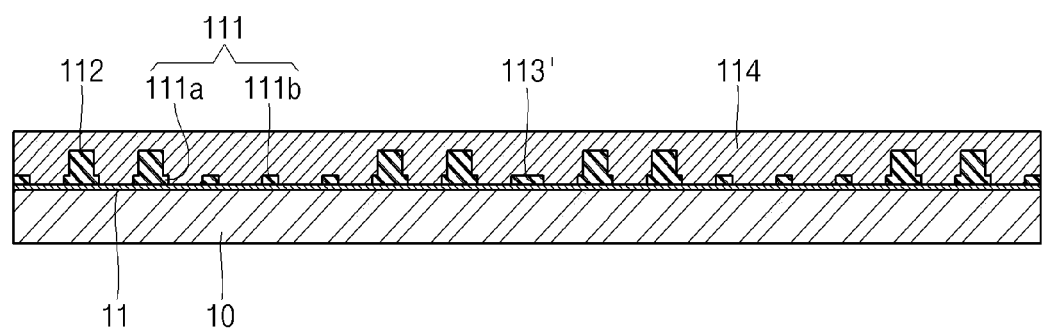
Figure 3D:
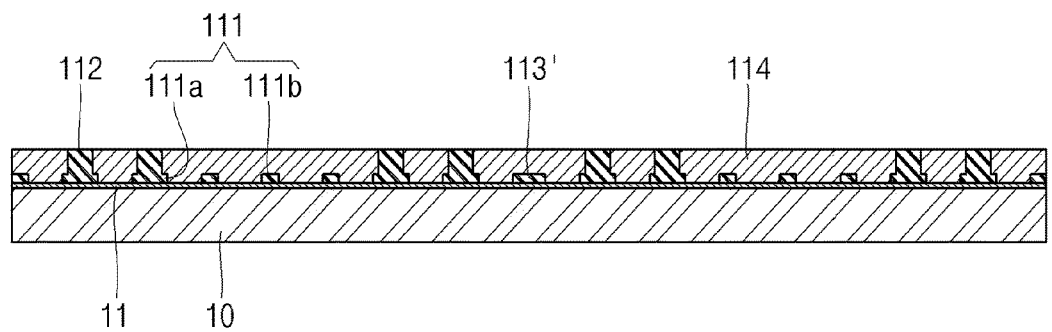

Though not shown in FIG. 3C, in an example implementation, the dielectric layer 114 might be formed in a manner that leaves the end surface(s) of the conductive via(s) 112 exposed (e.g., molding with a seal, utilizing film-assisted molding, etc.). Block 230 may comprise forming the dielectric layer 114 in any of a variety of manners, non-limiting example of which are provided herein. For example, block 230 may comprise forming the dielectric layer 114 by compression molding, transfer molding, liquid encapsulant molding, vacuum lamination, paste printing, film assisted molding, printing, spin coating, spray coating, sintering, thermal oxidation, plasma vapor deposition (PVD), chemical vapor deposition (CVD), etc. Note that although block 230 is presented as forming a single continuous dielectric layer 114 in a single forming process, in other example implementations, a plurality of dielectric layers may be formed (e.g., after the forming of the conductive layers, intermixed with the forming of the conductive layers, etc.).

The example method 200 may, at block 240, comprise removing a portion of or thinning the dielectric layer 114. An example of such thinning is provided at FIG. 3D (e.g., as compared to FIG. 3C). Block 240 may, for example, comprise thinning the dielectric layer 114 to expose end surfaces of the conductive via(s) 112 (e.g., the top surface of the conductive via(s) 112 in FIG. 3D). For example, the exposed end surfaces of the conductive via(s) 112 may be coplanar with the surface of the dielectric layer 114. In other example implementations, the end surfaces of the conductive via(s) 112 may extend beyond (or be recessed within) the dielectric layer 114.

Block 240 may comprise thinning the dielectric layer 114 in any of a variety of manners (e.g., mechanical grinding and/or chemical etching/polishing, etc.). Note that in an example implementation in which at block 230 the dielectric layer 114 is not formed to cover the ends of the conductive via(s) 112, block 240 may be skipped.

The example method 200 may, at block 250, comprise removing the carrier and the seed layer. An example of such removing is provided at FIG. 3E.

Block 250 may comprise removing the carrier 10 in any of a variety of manners, non-limiting examples of which are provided herein. For example, block 250 may comprise removing the carrier 10 by mechanical grinding and/or chemical etching. Block 250 may, for example, comprise removing the carrier 10 from a thermally releasable adhesive by applying heat and mechanical force. Also for example, block 250 may comprise pealing the carrier 10 from the rest of the substrate panel 110'.

Block 250 may comprise removing the seed layer 11 in any of a variety of manners, non-limiting examples of which are provided herein. For example, block 250 may comprise chemically etching the seed layer 11. Also for example, block 250 may comprise removing the seed layer 11 utilizing a combination of mechanical grinding and chemical etching. Note that block 250 may comprise removing the carrier 10 (and/or a portion thereof) and the seed layer 11 utilizing a same etching process or utilizing a multi-stage etching process (e.g., utilizing different chemicals and/or other process conditions). Note that in an example implementation in which a seed layer is not utilized in the manufacturing process, removal of the seed layer need not be performed.

After the removal of the carrier 10 and the seed layer 11, a surface of the central pattern 111 and the conductor formed in the saw region 113' may be exposed from the dielectric layer 114. Such exposed surfaces may be generally coplanar with a surface of the dielectric layer 114 (e.g., lower surfaces of such components in FIG. 3D, and upper surfaces of such components in FIG. 3E), but need not be. For example, such exposed conductor surfaces may be recessed in the dielectric layer 114 (e.g., through an etching process). In another example implementation, the removal of the carrier 10 and/or seed layer 11 (and/or some of the dielectric layer 114) may be performed in such a manner that surfaces of the central pattern 111 and the conductor formed in the saw region 113' protrude from the dielectric layer 114.

Figure 3E:
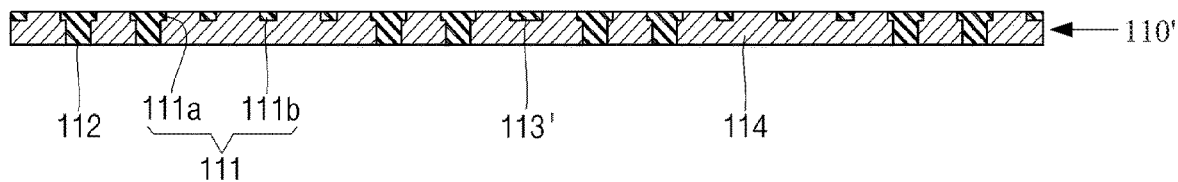

An example output substrate panel 110' of block 250 is shown at FIG. 3E. Note that such substrate panel 110' comprises a plurality of the substrate 110 shown in FIG. 1. The example substrate panel 110' may comprise any of a variety of configurations. For example, the substrate 110' may be shaped as a rectangular plate or panel, strip-shaped to accommodate a one-dimensional array of semiconductor devices, multi-dimensional array-shaped to accommodate a multi-dimensional array of semiconductor devices, shaped as a circular wafer, etc.

FIG. 3E shows the substrate panel 110' flipped relative to the various structures shown in FIGS. 3A to 3D. This orientation will be utilized for the remainder of FIGS. 3E to 3K. This orientation is shown for illustrative convenience and is not meant to necessarily indicate the orientation utilized during various manufacturing operations. In the example orientation shown in FIG. 3E, the central pattern 111 and conductor formed in the saw region 113' (which will ultimately result in the edge pattern 113) are exposed at the top side of the dielectric layer 114, and the conductive via(s) 112 are exposed at the bottom side of the dielectric layer 114.

The example method 200 may, at block 260, comprise attaching a semiconductor die. An example of such attaching is provided at FIG. 3F.

The semiconductor die 120 may, for example, comprise a first die side (e.g., a top side), a second die side (e.g., a bottom side), and a plurality of peripheral (or lateral) die sides extending between the first die side and the second die side. The semiconductor die 120 may comprise any of a variety of types of integrated circuit chips (e.g., general purposes processors, digital signal processors, audio and/or video processors, memory devices, power management units, network processors, radio frequency circuits, wireless baseband systems, sensors, application specific integrated circuits, etc.).

The semiconductor die 120 may comprise a conductive member 121 (or a plurality thereof) formed on the second die side for inputting and/or outputting electrical signals. The conductive member 121 may, for example, comprise any of a variety of conductive materials (e.g. aluminum, copper, silver, gold, titanium, nickel, chromium, tungsten, alloys thereof, etc.). The conductive member 121 may, for example, be exposed through a dielectric layer (e.g., a passivation layer) formed on the second die side of the die 120. Such a dielectric layer may, for example, protect underlying semiconductor material (e.g., silicon, etc.) of the die 120. Such a second die side of the semiconductor die 120 may, for example, comprise an active side of the die 120.

The conductive member 121 may comprise any of a variety of physical characteristics. For example, the conductive member 121 may comprise a conductive pad (e.g., a bond pad, etc.), a conductive pillar (or post) or wire, a conductive structure, etc.

Block 260 may, for example, comprise coupling the semiconductor die 120 to the central pattern 111, for example including the first portion 111a of the central pattern 111 that is connected to the conductive via(s) 112, and the second portion 111b of the central pattern 111 that is not connected to the conductive via(s) 112. Block 260 may comprise coupling the semiconductor die 120 to the central pattern 111 in a flip-chip manner as shown, in a wire-bonded manner, etc.

Block 260 may, for example, comprise mechanically and/or electrically connecting the conductive member 121 of the semiconductor die 120 to the central pattern 111 utilizing any of a variety of types of connection. For example, the connection may comprise a direct metal-to-metal bond, solder bond, epoxy bond, etc. In an example implementation, block 260 may comprise utilizing a conductive connection member 130 to provide the connection between the conductive member(s) 121 and the central pattern 111. The conductive connection member 130 may comprise any of a variety of characteristics. For example, the conductive connection member 130 may comprise solder (e.g., a solder cap or tip on the conductive member 121, a reflowed portion of the conductive member 121, a reflowed solder paste, etc.). Also for example, the conductive connection member 130 may comprise a conductive bump (e.g., a die bump, a wafer bump, a solder cap, etc.) and/or a reflowable portion thereof. The conductive connection member 130 may comprise any one or more of a variety of materials (e.g., solder, tin, copper, silver, lead, epoxy, etc.).

Figure 3F:
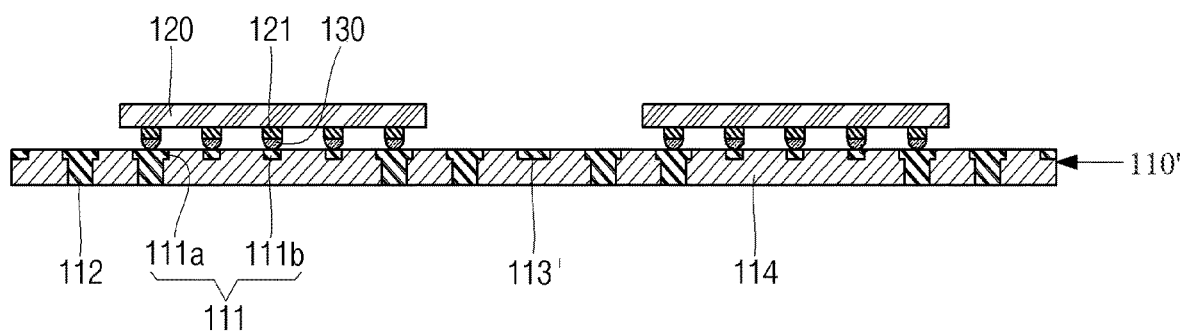
Figure 3G:
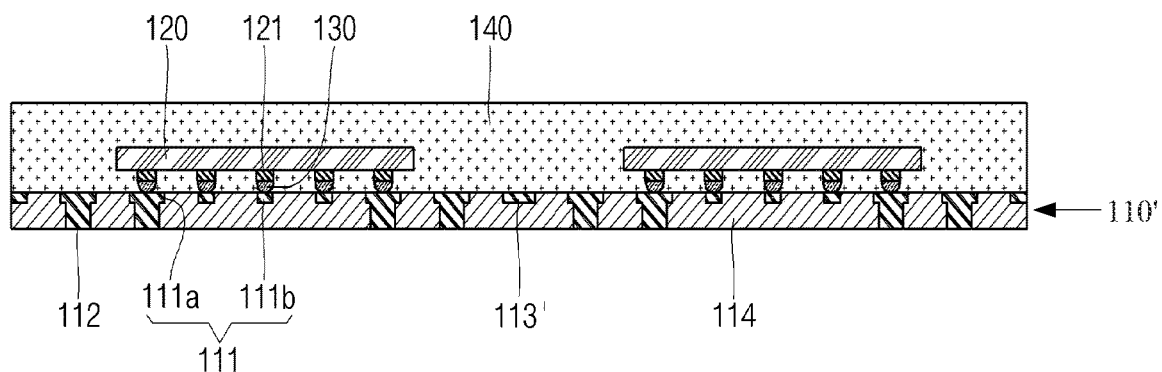
Figure 3H:
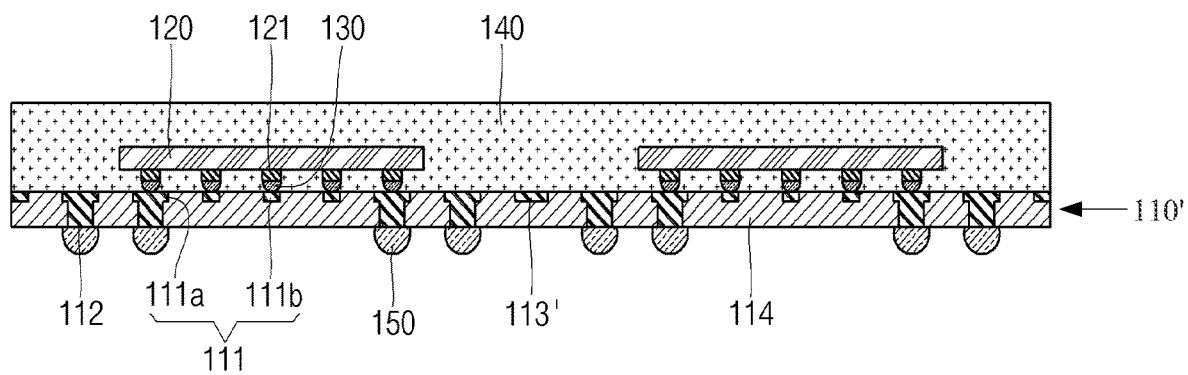

Though not explicitly shown in FIG. 2 and FIG. 3F, in a flip-chip configuration in which the front or active side of the semiconductor die 120 faces and is attached to the substrate 110, the example method 200 (e.g., at block 260), may comprise forming an underfill between the semiconductor die 120 and the substrate panel 110' (e.g., surrounding the conductive connection member(s) 130, etc.). Such underfilling may, for example, comprise capillary underfilling, utilizing a pre-applied underfill or a non-conductive paste during attachment of the semiconductor die 120, etc. As discussed herein, a molded underfill material may be formed (e.g., at block 270 during a molding process that forms the encapsulant 140 discussed herein).

In a semiconductor device configuration in which the back or inactive side of the semiconductor die 120 is attached to the substrate panel 110', the conductive connection member 130 may comprise a wirebond wire (e.g., gold, silver, copper, aluminum, alloys thereof, etc.) extending between the conductive member 121 of the die 120 and the conductive pattern 111. In such a configuration, the semiconductor die 120 may be mechanically coupled to the substrate panel 110' using an adhesive (e.g., a die attach film, a paste, a liquid, etc.).

Though FIG. 3F shows only two semiconductor die 120 attached to the substrate panel 110', for example at respective areas corresponding to respective semiconductor devices, it should be understood that any number of semiconductor devices may be formed on the substrate panel 110'. Also note that each semiconductor device, as discussed herein, may comprise a plurality of semiconductor die and/or passive components.

The example method 200 may, at block 270, comprise encapsulating. An example of such encapsulating is provided at FIG. 3G.

The encapsulant 140 may, for example, cover any or all of the first (or top) substrate side, the peripheral or lateral die sides of the semiconductor die 120, the first (or top) die side of the semiconductor die 120, the second (or bottom) die side of the semiconductor die 120, side surfaces of the conductive member(s) 121, side surfaces of the conductive connection member(s) 130, etc. The encapsulant 140 may, for example, comprise a first surface (e.g., a top surface) that is parallel to the first surface (e.g., top surface) of the substrate panel 110' at a distance from the substrate panel 110' greater than any or all surfaces of the semiconductor die 120. For example, the encapsulant 140 may be thicker than the semiconductor die 120, thicker than the distance from the top die surface of the semiconductor die 120 from the substrate panel 110', etc.

The encapsulant 140 may comprise characteristics of any of a variety of materials. For example, the encapsulant 140 may comprise one or more of resin, polymer, polymer composite material (such as epoxy resin with filler, epoxy acrylate with filler, or polymer with a filler), etc. Also for example, the encapsulant 140 may comprise one or more of any of the organic and/or inorganic dielectric materials discussed herein. The encapsulant 140 may, for example, protect various components of the semiconductor device 100 from external conditions.

Block 270 may comprise performing the encapsulating in any of a variety of manners, non-limiting examples of which are provided herein. For example, block 270 may comprise performing the encapsulating by compression molding, transfer molding, liquid encapsulant molding, vacuum lamination, paste printing, film assisted molding, etc. Also for example, block 270 may comprise encapsulating by printing, spin coating, spray coating, sintering, thermal oxidation, plasma vapor deposition (PVD), chemical vapor deposition (CVD), etc.

The example method 200 may, at block 280, comprise forming interconnection structures. An example of such forming is provided at FIG. 3H.

In general, the conductive interconnection structure(s) 150 may be utilized to electrically and/or mechanically attach the example semiconductor device 100 to another part (e.g., to another electronic device, to a packaging substrate of a multi-device package, to a motherboard, etc.). The conductive interconnection structure(s) 150, for example, provide a path through which electric signals (e.g., digital signals, analog signals, electrical power signals, etc.) may be communicated to and/or from the device 100.

The conductive interconnection structure 150 (e.g., a package interconnection structure, etc.) may comprise characteristics of any of a variety of types of conductive interconnection structures (e.g., conductive balls, solder balls, conductive bumps, solder bumps, wires, leads, pads, land grid array (LGA) lands, etc.). For example, the example device 100 shown in FIG. 1 comprises a ball grid array (BGA) configuration in which the conductive interconnection structure(s) 150 comprise conductive ball(s) 150 arranged in a multi-dimensional array. In another example implementation, the interconnection structure(s) 150 comprise bare lands in a land grid array (LGA) configuration.

The conductive interconnection structure 150 may comprise any of a variety of materials (e.g., tin, copper, silver, lead, alloys thereof, etc.).

Block 280 may comprise forming the conductive interconnection structure(s) 150 in any of a variety of manners, non-limiting examples of which are provided herein. In the example shown in FIG. 3H, the conductive interconnection structure 150 comprises a conductive ball 150 that is bonded to a portion of the conductive via 112 exposed at the second side (e.g., lower side in FIG. 3H) of the substrate panel 110'. In such example, block 280 may comprise attaching (e.g., welding, reflowing, etc.) a preformed conductive ball 150 to the conductive via 112. As another example, block 280 may comprise applying a solder paste to the conductive via 112, and then reflowing the applied paste form the conductive ball 150 (or bump). Block 280 may also, for example, comprise forming the interconnection structure 150 by plating up the conductive interconnection structure 150 (e.g., as a post, pillar, etc.). Block 280 may additionally, for example, comprise forming the interconnection structure 150 by attaching a wire, stud, pillar, or any of a variety of such types of structures, to the conductive via 112.

Note that in various example implementations, block 280 may comprise forming underbump metallization between the conductive via 112 and the conductive interconnection structure 150. In an example implementation, block 280 may comprise forming an under bump metallization (UBM) structure by forming a layer of titanium (Ti) or titanium-tungsten (TiW), for example by sputtering, forming a layer of copper (Cu) on the titanium or titanium-tungsten layer, for example by sputtering, and forming a layer of nickel (Ni) on the copper layer, for example by electroplating. Continuing the example, block 280 may then, for example, comprise forming a lead free solder material on the nickel layer of the UBM structure by electroplating, wherein the lead free solder material has a composition by weight of 1% to 4% silver (Ag) and the remainder of the composition by weight is tin (Sn).

The example method 200 may, at block 290, comprise singulating. An example of such singulating is provided at FIGS. 3I, 3J, and 3K. Block 290 may comprise performing such singulating in any of a variety of manners, non-limiting examples of which are provided herein. Such singulating may, for example, produce individual semiconductor device packages from a panel of such packages.

Figure 3I:
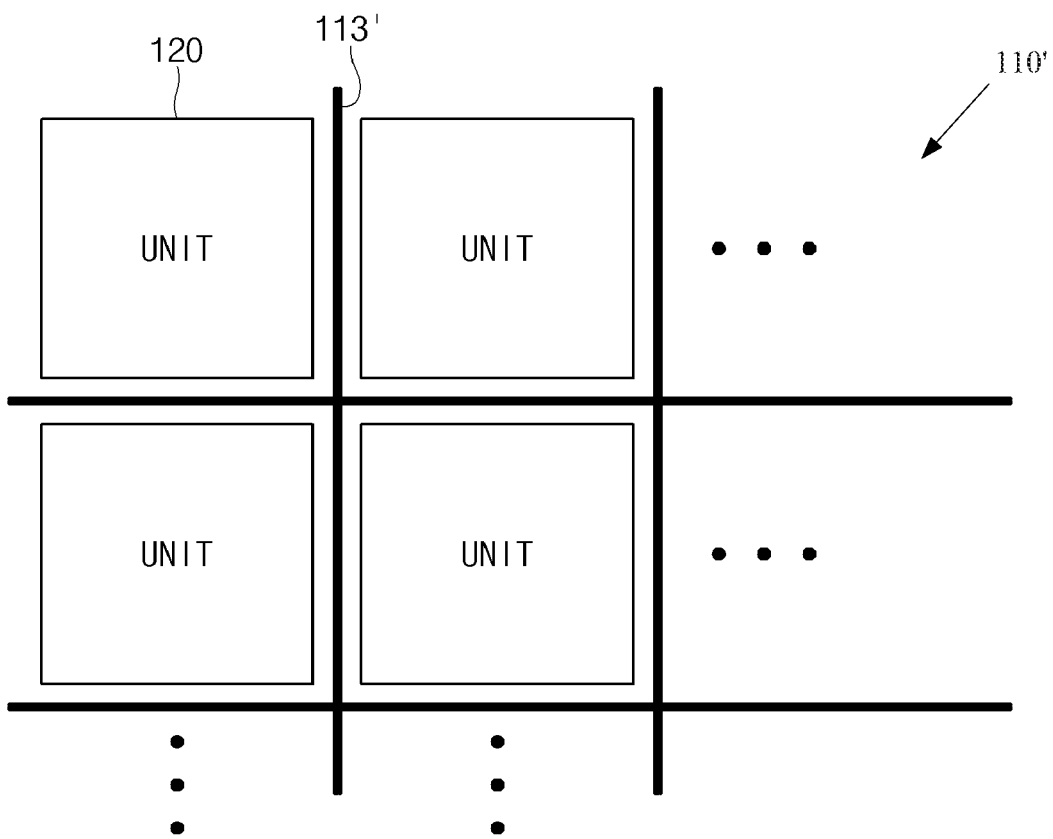
Figure 3J:
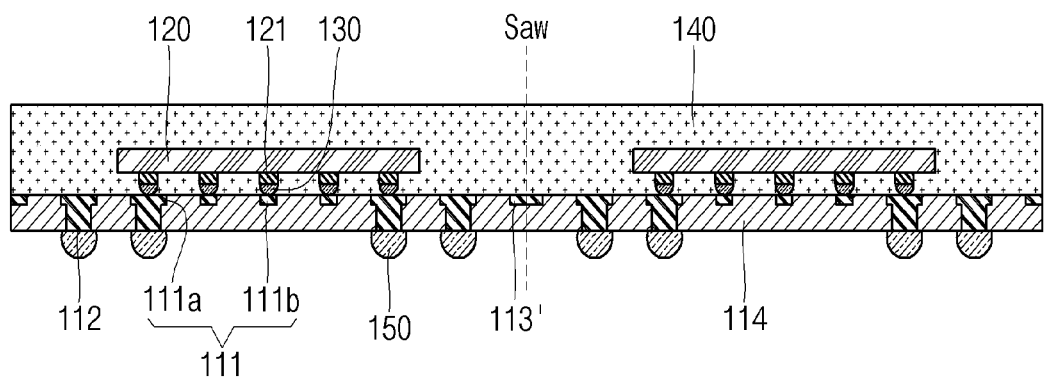

Block 290 may, for example, perform the singulating along a singulation line (e.g., labeled "Saw" in the Figures) in the sawing region 113'. FIG. 3I shows an example top-down view of a panel of semiconductor devices 120 prior to singulation. As discussed herein, prior to singulation, the semiconductor devices 120 may be arranged in a one-dimensional array or in a multi-dimensional array on a substrate panel 110'. The sawing regions 113' and thus singulation lines may be formed in a grid configuration, for example in which rows and columns define individual semiconductor devices 100.

The saw (e.g., saw blade, laser or other directed energy device, knife, nibbler, etc.) may, for example, have a cutting width that is narrower than the sawing region 113'. In such case, as shown in FIG. 1, the edge pattern 113 remains from portions of the conductor formed in the sawing region 113' that are not destroyed or removed during the singulating. Referring back to FIG. 1, the remaining edge pattern 113 may be exposed from the first (or top) substrate surface and from the peripheral (or lateral) substrate surfaces, and may extend completely around the perimeter of the substrate 110.

The edge pattern 113 provides various benefits. For example, the edge pattern 113 provides protection for the substrate 110 during singulation (e.g., preventing or reducing fracturing of the dielectric layer 114 of the substrate 110 during singulation) and may also be utilized as an electromagnetic shield (e.g., in a configuration in which the edge pattern 113 is grounded).

Figure 3K:
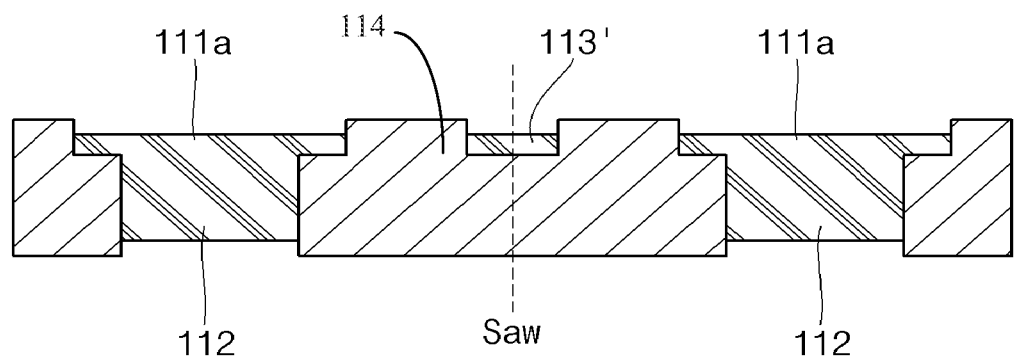

As discussed herein, the exposed surfaces of the central pattern 111 and the edge pattern 113 may be coplanar with the corresponding surface of the dielectric layer 114, but need not be. Similarly, the exposed surfaces of the conductive via(s) 112 may be coplanar with the corresponding surface of the dielectric layer 114, but need not be. An example in which the conductor surfaces are recessed relative to the corresponding surface of the dielectric layer 114 is shown at FIG. 3K. Any of the conductors (e.g., the central pattern 111, the edge pattern 113, and/or the conductive via 112) may alternatively extend from the corresponding surface of the dielectric layer 114.

In another example implementation, the edge pattern may be coupled to a conductor in a manner similar to the manner in which the first portion 111a of the central pattern 111 is coupled to the conductive via 112 of the example semiconductor device 100 of FIGS. 1-3. An example of this is shown at FIGS. 4-5.

Figure 4:
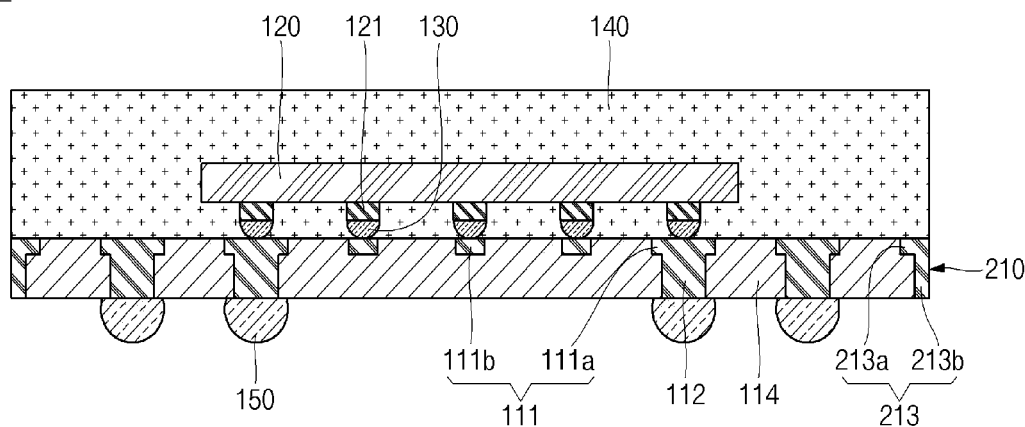
FIG. 4 is a cross-sectional view illustrating an example semiconductor device in accordance with various aspects of the present disclosure.
Figure 5:
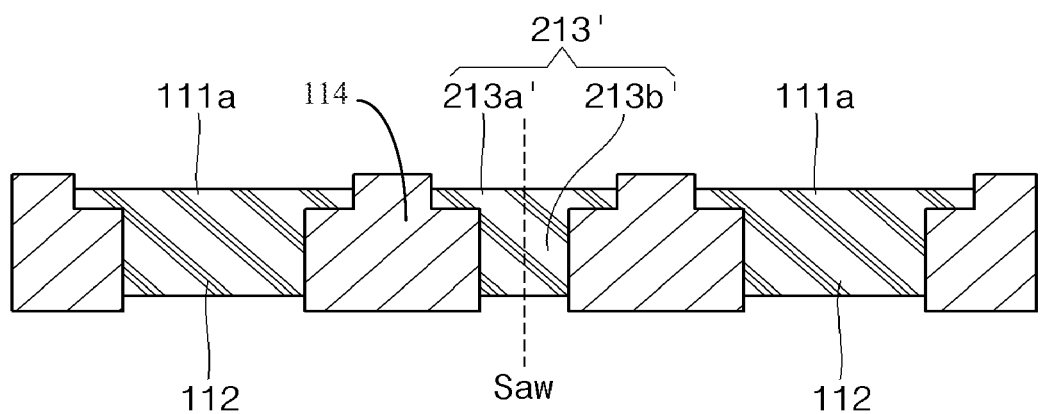
FIG. 5 is a cross-sectional view illustrating various aspects of a method of manufacturing the example semiconductor device of FIG. 4.

FIG. 4 is a cross-sectional view illustrating an example semiconductor device 200 in accordance with various aspects of the present disclosure. The example semiconductor device 200 may, for example, share any or all characteristics with the example semiconductor device 100 shown and discussed herein with regard to FIGS. 1-3. FIG. 5 is a cross-sectional view illustrating various aspects of a method of manufacturing the example semiconductor device 200 of FIG. 4. The example method may, for example, share any or all characteristics with the example method 200 shown and discussed herein with regard to FIGS. 2-3. The following discussion will mainly focus on differences from the other example implementations presented herein.

In the example semiconductor device 100 shown in FIG. 1 and/or as manufactured by the example method 200 shown in FIGS. 2-3, the edge pattern 113 did not extend from the first (or top) side of the substrate 110 to the second (or bottom) side of the substrate 110. In the example semiconductor device 200 shown in FIG. 4, however, the edge pattern 213 extends from the first (or top) side of the substrate 110 to the second (or bottom) side of the substrate 201.

The example edge pattern 213 may, for example, comprise a first portion 213a. As with the edge pattern 113 of the example semiconductor device 100 of FIG. 1, the first portion 213a of the edge pattern 213 may, for example, be formed as part of a same first conductive layer as the central pattern 111. For example, referring back to FIG. 2, block 210 may comprise forming the central pattern 111 and the first portion 213a of the edge pattern 213. The first portion 213a of the edge pattern 213 may, for example, have a same thickness (e.g., vertical distance in FIGS. 4-5) as the central pattern 111 and/or may comprise the same material(s) as the central pattern 111.

The example edge pattern 213 may also, for example, comprise a second portion 213b. The second portion 213b may, for example, be formed as part of a same second conductive layer as the conductive via(s) 112. For example, referring back to FIG. 2, block 220 may comprise forming the conductive via(s) 112 and the second portion 213b of the edge pattern 213. The second portion 213b of the edge pattern 213 may, for example, have a same thickness (e.g., vertical distance in FIGS. 4-5) as the conductive via(s) 112 and/or may comprise the same material(s) as the conductive via(s) 112.

In the example shown in FIGS. 4-5, the width (e.g., lateral width) of the first portion 213a of the edge pattern 213 may be greater than the width (e.g., lateral width) of the second portion 213b. Accordingly, after the singulating (e.g., at block 290, and along the singulation line (labeled "Saw") in the sawing region 213' of FIG. 5), the first portion 213a of the edge pattern 213 will extend a larger distance into the interior of the substrate 201 than the second portion 213b of the edge pattern 213.

As with the first portion 213a of the edge pattern 213, the second portion 213b of the edge pattern 213 may extend completely around the perimeter of the substrate 201. For example, the edge pattern 213 may completely make up the peripheral (or lateral) sides of the substrate 201.

The edge pattern 213 provides various benefits. For example, the edge pattern 213 provides protection for the substrate 201 during singulation (e.g., preventing or reducing fracturing of the dielectric layer 114 during singulation). For example, during singulation (e.g., at block 290, and along the singulation line of FIG. 5), the cutting might occur only through the conductive material formed at the sawing region 213' and thus not contact the dielectric layer 114. Also, the resulting edge pattern 213 may be utilized as an electromagnetic shield (e.g., in a configuration in which the edge pattern 213 is grounded). Relative to the edge pattern 113 of FIGS. 1-3, the edge pattern 213 of FIGS. 4-5 may completely make up the peripheral (or lateral) sides of the substrate 201, providing for enhanced electromagnetic shielding.

As discussed herein with regard to other example implementations, the exposed surface of the central pattern 111 and the first portion 213a of the edge pattern 213 may be coplanar with the corresponding surface of the dielectric layer 114, but need not be. Similarly, the exposed surfaces of the conductive via(s) 112 and the second portion 213a of the edge pattern 213 may be coplanar with the corresponding surface of the dielectric layer 114, but need not be. An example implementation in which the conductor surfaces are recessed relative to the corresponding surface of the dielectric layer 114 is shown at FIG. 5. Any of the conductors (e.g., the central pattern 111, the first portion 213a of the edge pattern 213, the second portion 213b of the edge pattern 213, and/or the conductive via 112) may alternatively extend from the corresponding surface of the dielectric layer 114.

In another example implementation, relative to the example semiconductor device 200 of FIGS. 4-5, the edge pattern may comprise a uniform width (e.g., lateral or horizontal width). An example of this is shown at FIGS. 6-7.

Figure 6:
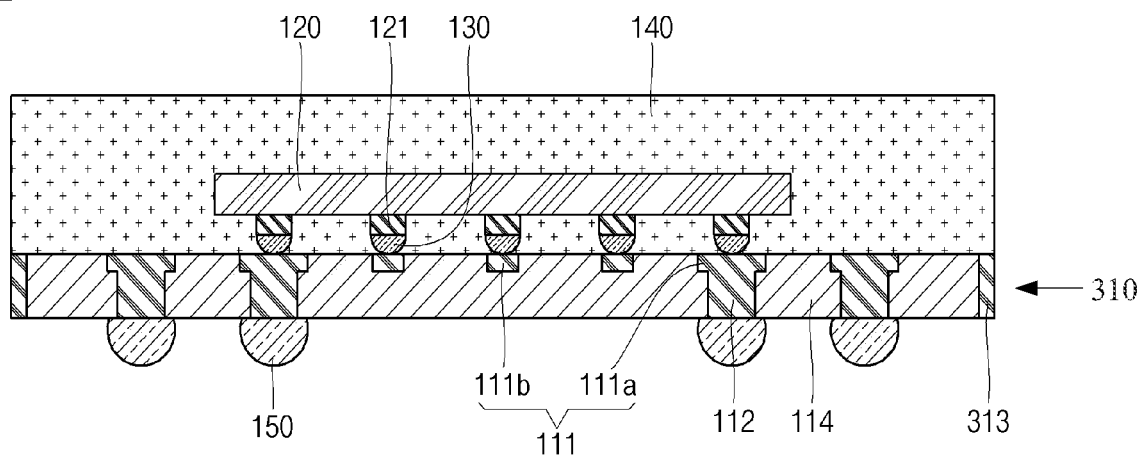
FIG. 6 is a cross-sectional view illustrating an example semiconductor device in accordance with various aspects of the present disclosure.
Figure 7:
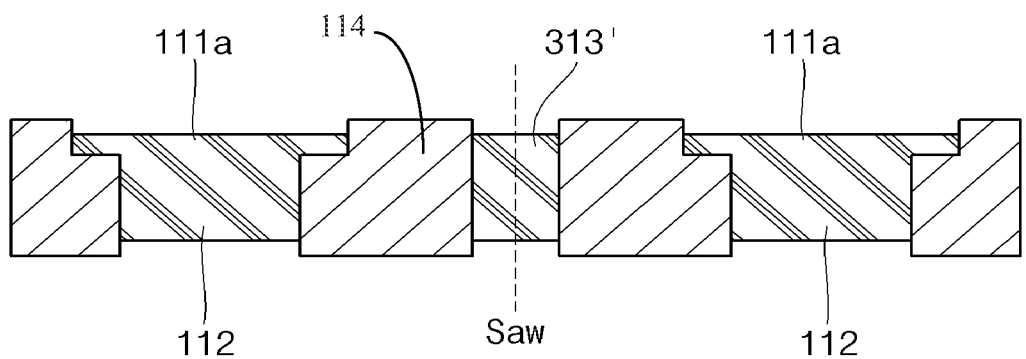
FIG. 7 is a cross-sectional view illustrating various aspects of a method of manufacturing the example semiconductor device of FIG. 6.

FIG. 6 is a cross-sectional view illustrating an example semiconductor device 300 in accordance with various aspects of the present disclosure. The example semiconductor device 300 may, for example, share any or all characteristics with the example semiconductor device 100 shown and discussed herein with regard to FIGS. 1-3 and/or with the example semiconductor device 200 shown and discussed herein with regard to FIGS. 4-5. FIG. 7 is a cross-sectional view illustrating various aspects of a method of manufacturing the example semiconductor device 300 of FIG. 6. The example method may, for example, share any or all characteristics with the example method 200 shown and discussed herein with regard to FIGS. 2-3 and/or with the example method shown and discussed herein with regard to FIG. 5, etc. The following discussion will mainly focus on differences from the other example implementations presented herein.

In the example semiconductor device 200 shown in FIG. 4 and/or as manufactured by the example method 200 shown in FIGS. 2-3 and FIG. 5, the first portion 213a of the edge pattern 213 is wider (e.g., laterally or horizontally wider) than the second portion 213b of the edge pattern 213. In the example semiconductor device 300 shown in FIG. 6, however, the edge pattern 313 extends from the first (or top) side of the substrate 310 to the second (or bottom) side of the substrate 310 and has a constant width.

Though not explicitly illustrated in FIG. 6, the example edge pattern 313 may, for example, comprise a first portion. As with the first portion 213a of the edge pattern 213 of the example semiconductor device 200 of FIG. 4, the first portion of the edge pattern 313 may, for example, be formed as part of a same first conductive layer as the central pattern 111. For example, referring back to FIG. 2, block 210 may comprise forming the central pattern 111 and the first portion of the edge pattern 313. The first portion of the edge pattern 213 may, for example, have a same thickness (e.g., vertical distance in FIGS. 6-7) as the central pattern 111 and/or may comprise the same material(s) as the central pattern 111.

The example edge pattern 313 may also, for example, comprise a second portion. The second portion of the edge pattern 313 may, for example, be formed as part of a same second conductive layer as the conductive via(s) 112. For example, referring back to FIG. 2, block 220 may comprise forming the conductive via(s) 112 and the second portion of the edge pattern 313. The second portion of the edge pattern 313 may, for example, have a same thickness (e.g., vertical distance in FIGS. 6-7) as the conductive via(s) 112 and/or may comprise the same material(s) as the conductive via(s) 112.

Note that in an alternative implementation, the example edge pattern 313 may be formed as a single continuous conductor in a single manufacturing operation (e.g., formed separately from the first conductive layer at block 210 and the second conductive layer at block 220). Also note that in the example scenario in which the edge pattern 313 comprises multiple portions formed separately, there may be a slight discontinuity at the portion-to-portion interface, for example due to manufacturing variances, but this is still within the scope of this disclosure.

In the example shown in FIGS. 6-7, the width (e.g., lateral width) of the edge pattern 313 (e.g., as a single continuous conductor, as a first portion and a second portion, etc.) may be constant. Accordingly, after the singulating (e.g., at block 290, and along the singulation line (labeled "Saw") in the sawing region 313' of FIG. 7), the edge pattern 313 will extend a constant distance into the interior of the substrate 310.

The edge pattern 313 may, for example, extend completely around the perimeter of the substrate 310. For example, the edge pattern 313 may completely make up the peripheral (or lateral) sides of the substrate 310.

The edge pattern 313 provides various benefits. For example, the edge pattern 313 provides protection for the substrate 310 during singulation (e.g., preventing or reducing fracturing of the dielectric layer 114 during singulation). For example, during singulation (e.g., at block 290, and along the singulation line of FIG. 7), the cutting might occur only through the conductive material formed at the sawing region 313' and thus not contact the dielectric layer 114. Also, the resulting edge pattern 313 may be utilized as an electromagnetic shield (e.g., in a configuration in which the edge pattern 313 is grounded). Relative to the edge pattern 113 of FIGS. 1-3, the edge pattern 313 of FIGS. 6-7 may completely make up the peripheral (or lateral) sides of the substrate 310, providing for enhanced electromagnetic shielding.

As discussed herein with regard to other example implementations, the exposed surface of the central pattern 111 and the first portion (or top end) of the edge pattern 313 may be coplanar with the corresponding surface of the dielectric layer 114, but need not be. Similarly, the exposed surfaces of the conductive via(s) 112 and the second portion (or bottom end) of the edge pattern 313 may be coplanar with the corresponding surface of the dielectric layer 114, but need not be. An example implementation in which the conductor surfaces are recessed relative to the corresponding surface of the dielectric layer 114 is shown at FIG. 7. Any of the conductors (e.g., the central pattern 111, the first portion of the edge pattern 313, the second portion of the edge pattern 313, and/or the conductive via 112) may alternatively extend from the corresponding surface of the dielectric layer 114.

In another example implementation, relative to the example semiconductor device 200 of FIGS. 4-5, a first portion of the edge pattern may comprise a smaller width (e.g., lateral or horizontal width) than a second portion of the edge pattern. An example of this is shown at FIGS. 8-9.

Figure 8:
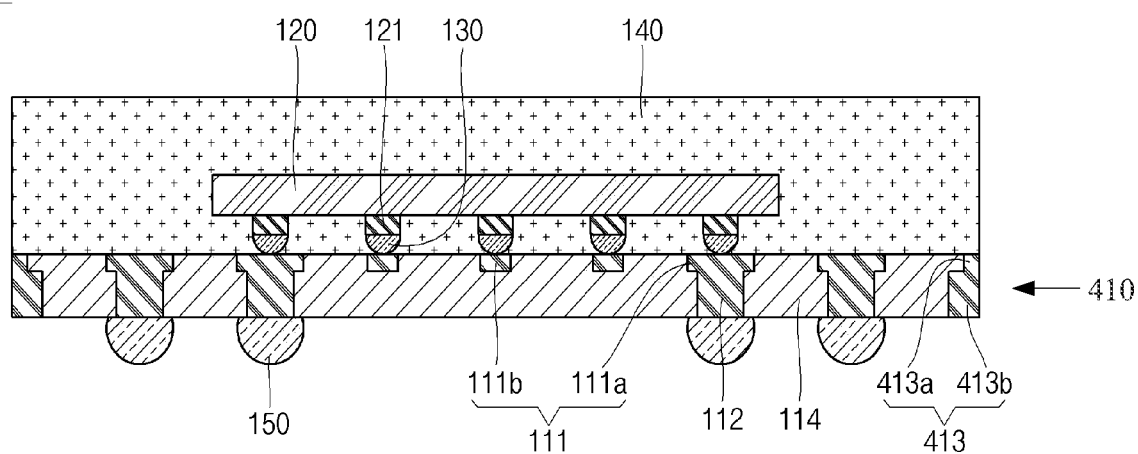
FIG. 8 is a cross-sectional view illustrating an example semiconductor device in accordance with various aspects of the present disclosure.
Figure 9:
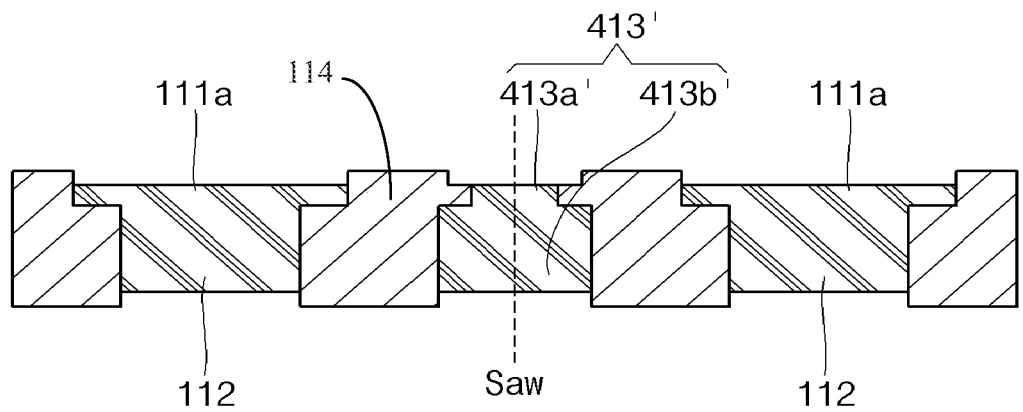
FIG. 9 is a cross-sectional view illustrating various aspects of a method of manufacturing the example semiconductor device of FIG. 8.

FIG. 8 is a cross-sectional view illustrating an example semiconductor device 400 in accordance with various aspects of the present disclosure. The example semiconductor device 400 may, for example, share any or all characteristics with the example semiconductor devices 100, 200, and/or 300, shown and discussed herein with regard to FIGS. 1-7. FIG. 9 is a cross-sectional view illustrating various aspects of a method of manufacturing the example semiconductor device 400 of FIG. 8. The example method may, for example, share any or all characteristics with the example method 200 shown and discussed herein with regard to FIGS. 2-3, with the example method shown and discussed herein with regard to FIG. 5, and/or with the example method shown and discussed herein with regard to FIG. 7, etc. The following discussion will mainly focus on differences from the other example implementations presented herein.

In the example semiconductor device 200 shown in FIG. 4 and/or as manufactured by the example method shown in FIGS. 2-3 and 5, the edge pattern 213 extended completely between the first (or top) side of the substrate 201 to the second (or bottom) side of the substrate 201. The example edge pattern 213 comprised a first (or top) portion 213a and a second (or bottom) portion 213b, where the width (e.g., a lateral or horizontal width) of the first portion 213a was greater than the width (e.g., a lateral or horizontal width) of the second portion 213b. The example semiconductor device 400, however, comprises an edge pattern 413 in which a first (or top) portion 413a has a width (e.g., a lateral or horizontal width) that is less than that of a second (or bottom) portion 413b.

The example edge pattern 413 may, for example, comprise a first portion 413a. As with the edge pattern 113 of the example semiconductor device 100 of FIG. 1, the first portion 413a of the edge pattern 413 may, for example, be formed as part of a same first conductive layer as the central pattern 111. For example, referring back to FIG. 2, block 210 may comprise forming the central pattern 111 and the first portion 413a of the edge pattern 413. The first portion 413a of the edge pattern 413 may, for example, have a same thickness (e.g., vertical distance in FIGS. 8-9) as the central pattern 111 and/or may comprise the same material(s) as the central pattern 111.

The example edge pattern 413 may also, for example, comprise a second portion 413b. The second portion 413b may, for example, be formed as part of a same second conductive layer as the conductive via(s) 112. For example, referring back to FIG. 2, block 220 may comprise forming the conductive via(s) 112 and the second portion 413b of the edge pattern 413. The second portion 413b of the edge pattern 413 may, for example, have a same thickness (e.g., vertical distance in FIGS. 8-9) as the conductive via(s) 112 and/or may comprise the same material(s) as the conductive via(s) 112.

In the example shown in FIGS. 8-9, the width (e.g., lateral width) of the first portion 413a of the edge pattern 413 may be less than the width (e.g., lateral width) of the second portion 413b. Accordingly, after the singulating (e.g., at block 290, and along the singulation line (labeled "Saw") in the sawing region 413' of FIG. 9), the first portion 413a of the edge pattern 413 will extend a smaller distance into the interior of the substrate 410 than the second portion 413b of the edge pattern 413.

As with the first portion 413a of the edge pattern 413, the second portion 413b of the edge pattern 413 may extend completely around the perimeter of the substrate 410. For example, the edge pattern 413 may completely make up the peripheral (or lateral) sides of the substrate 410.

The edge pattern 413 provides various benefits. For example, the edge pattern 413 provides protection for the substrate 410 during singulation (e.g., preventing or reducing fracturing of the dielectric layer 114 during singulation). For example, during singulation (e.g., at block 290, and along the singulation line (labeled "Saw") of the sawing region 413a of FIG. 9), the cutting might occur only through the conductive material formed at the sawing region 413a and thus not contact the dielectric layer 114. Also, the edge pattern 413 may be utilized as an electromagnetic shield (e.g., in a configuration in which the edge pattern 413 is grounded). As with the edge pattern 213 of FIGS. 4-5, the edge pattern 413 of FIGS. 8-9 may completely make up the peripheral (or lateral) sides of the substrate 410, providing for enhanced electromagnetic shielding.

As discussed herein with regard to other example implementations, the exposed surface of the central pattern 111 and the first portion 413a of the edge pattern 413 may be coplanar with the corresponding surface of the dielectric layer 114, but need not be. Similarly, the exposed surfaces of the conductive via(s) 112 and the second portion 413a of the edge pattern 413 may be coplanar with the corresponding surface of the dielectric layer 114, but need not be. An example in which the conductor surfaces are recessed relative to the corresponding surface of the dielectric layer 114 is shown at FIG. 9. Any of the conductors (e.g., the central pattern 111, the first portion 413a of the edge pattern 413, the second portion 413b of the edge pattern 413, and/or the conductive via 112) may alternatively extend from the corresponding surface of the dielectric layer 114.

As discussed herein, an edge pattern may be connected to ground or other reference voltage. In general, an edge pattern may be coupled to any signal of the semiconductor device. In various example implementations, any of the semiconductor devices discussed herein (e.g., semiconductor devices 100, 200, 300, 400, etc.) may comprise a connecting pattern that electrically connects the central pattern to the edge pattern. Numerous examples of such implementations will now be provided.

Figure 10:
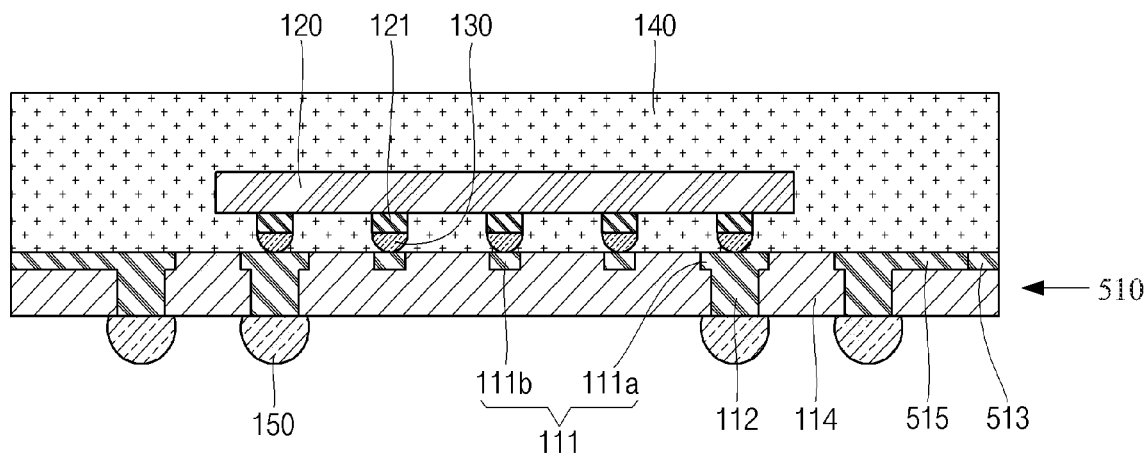
FIG. 10 is a cross-sectional view illustrating an example semiconductor device in accordance with various aspects of the present disclosure.
Figure 11:
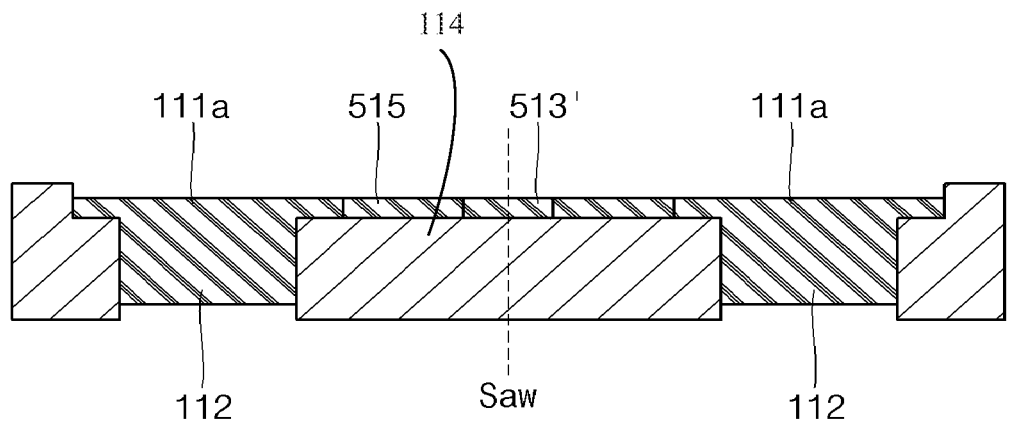
FIG. 11 is a cross-sectional view illustrating various aspects of a method of manufacturing the example semiconductor device of FIG. 10.
Figure 12:
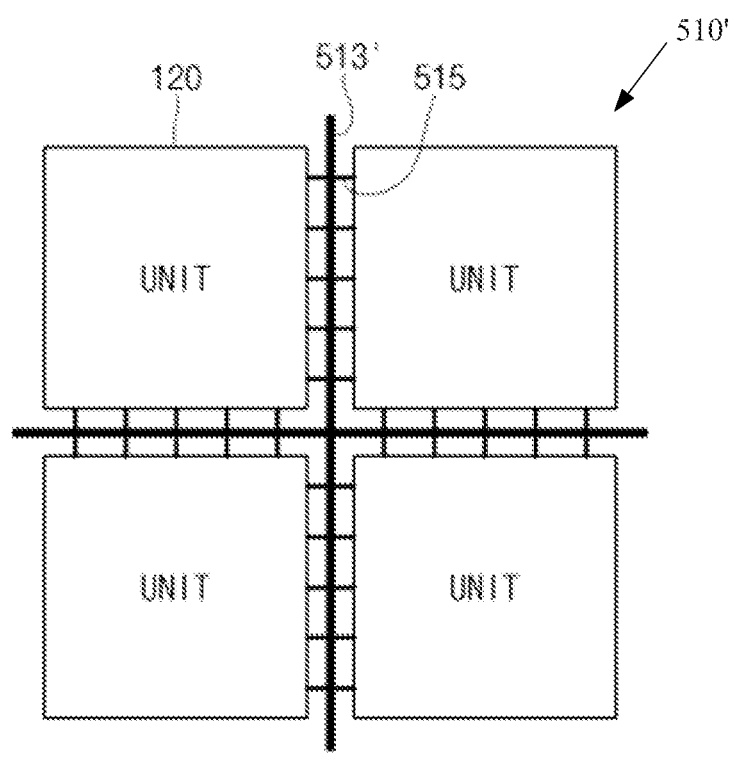
FIG. 12 is a cross-sectional view illustrating various aspects of a method of manufacturing the example semiconductor device of FIG. 10.

FIG. 10 is a cross-sectional view illustrating an example semiconductor device 500 in accordance with various aspects of the present disclosure. The example semiconductor device 500 may, for example, share any or all characteristics with the example semiconductor devices 100, 200, 300, and/or 400, shown and discussed herein with regard to FIGS. 1-9. FIGS. 11 and 12 are cross-sectional views illustrating various aspects of a method of manufacturing the example semiconductor device 500 of FIG. 10. The example method may, for example, share any or all characteristics with the example method 200 shown and discussed herein with regard to FIGS. 2-3. The following discussion will mainly focus on differences from the other example implementations presented herein. In particular, the following discussion will mainly focus on the differences between the example semiconductor device 500, and method of manufacturing thereof, and the example semiconductor device 100, and method of manufacturing thereof, shown and discussed herein with regard to FIGS. 1-3.

The example semiconductor device 500 comprises an edge pattern 513. Such edge pattern 513 may, for example, share any or all characteristics with the edge pattern 113 of the example semiconductor device 100 shown and discussed herein with regard to FIGS. 1-3. For example, as with the edge pattern 113, the edge pattern 513 may comprise the remnants of a conductive layer formed in the sawing region 513' (as shown in FIG. 11) after such region is sawn during singulation.

The example semiconductor device 500 also comprises a connecting pattern 515 (or a plurality thereof) that extends between, and electrically connects, the central pattern 111 and the edge pattern 513. In an example implementation, the central pattern 111, connecting pattern 515, and edge pattern 513 may be formed in a same conductive layer forming operation (e.g., at block 210 of the example method 200 of FIGS. 2-3). As shown in FIGS. 10-12, the connecting pattern 515 (or portions thereof) may extend horizontally between the central pattern 111 and the edge pattern 513.

For example, the central pattern 111, connecting pattern 515, and edge pattern 513 may comprise a same thickness (e.g., a vertical thickness in FIGS. 10-11) and/or be made from a same material. Though the central pattern 111, connecting pattern 515, and edge pattern 513 are presented in FIGS. 10-11 in discrete sections for illustrative clarity, where such elements connect, such elements may be formed as a single continuous (or integral) part.

FIG. 12 shows a top view of an example panel 510' of the semiconductor devices in which the conductor formed in the sawing region 513' is coupled to the central pattern by the connecting pattern 515 in an array or grid form. Though not shown, the connecting pattern 515 may comprise a series of conductors located around the entire periphery of each of the semiconductor devices 100 and extending between the central pattern 111 (e.g., an outer portion of the central pattern 111) and the conductor of the sawing region 513', for example as spokes connecting the central pattern 111 to the sawing region 513' (or edge pattern 513).

As shown, the edge pattern 513 may be electrically coupled to an interconnection structure 150 by the connecting pattern 515, the central pattern 111, and the conductive via 112. In an example implementation, such interconnection structure 150 (or a plurality of similarly connected interconnection structures 150) may be grounded, for example to enhance the electromagnetic interference protection provided by the edge pattern 513.

Figure 13:
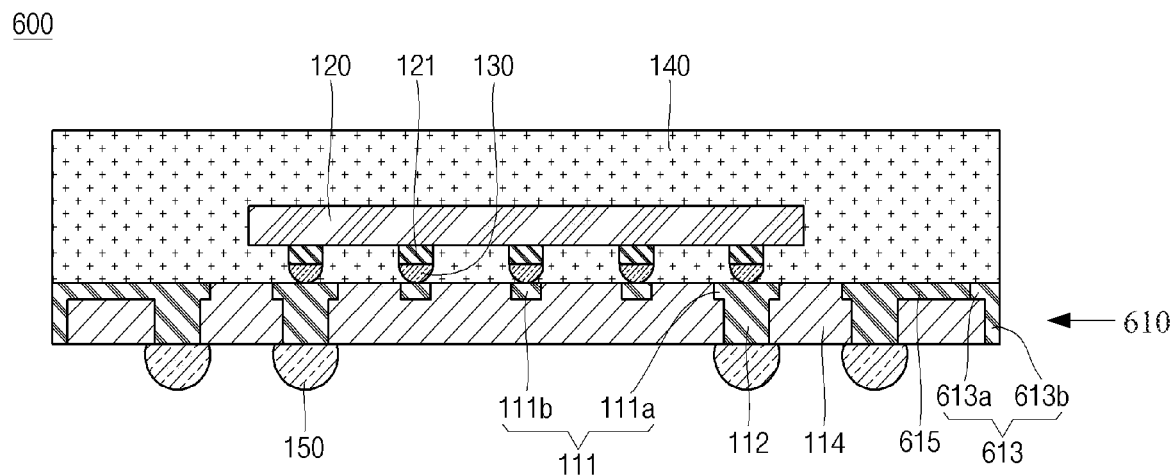
FIG. 13 is a cross-sectional view illustrating an example semiconductor device in accordance with various aspects of the present disclosure.
Figure 14:
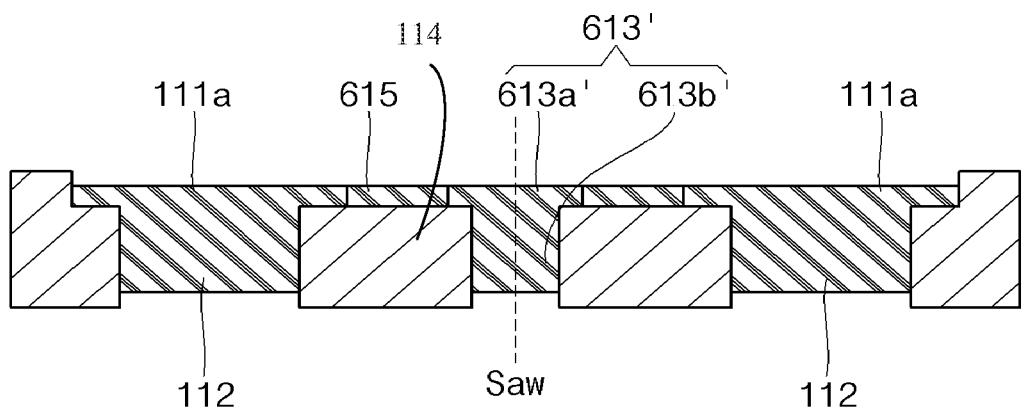
FIG. 14 is a cross-sectional view illustrating various aspects of a method of manufacturing the example semiconductor device of FIG. 13.

Another example implementation is shown in FIGS. 13-14. FIG. 13 is a cross-sectional view illustrating an example semiconductor device in accordance with various aspects of the present disclosure. The example semiconductor device 600 may, for example, share any or all characteristics with the example semiconductor devices 100, 200, 300, 400 and/or 500, shown and discussed herein with regard to FIGS. 1-12. FIG. 14 is a cross-sectional view illustrating various aspects of a method of manufacturing the example semiconductor device 600 of FIG. 13. The example method may, for example, share any or all characteristics with the example method 200 shown and discussed herein with regard to FIGS. 2-3. The following discussion will mainly focus on differences from the other example implementations presented herein. In particular, the following discussion will mainly focus on the differences between the example semiconductor device 600 and the example semiconductor device 200 shown and discussed herein with regard to FIG. 4, and between their respective manufacturing methods.

The example semiconductor device 600 comprises an edge pattern 613. Such edge pattern 613 may, for example, share any or all characteristics with the edge pattern 213 of the example semiconductor device 200 shown and discussed herein with regard to FIGS. 4-5. For example, as with the edge pattern 213, the edge pattern 613 may comprise the remnants of a conductive layer formed in the sawing region 613' (as shown in FIG. 14) after such region is sawn during singulation.

The example semiconductor device 600 also comprises a connecting pattern 615 (or a plurality thereof) that extends between, and electrically connects, the central pattern 111 and the edge pattern 613. In an example implementation, the central pattern 111, connecting pattern 615, and edge pattern 613 (or a first portion 613*a* thereof) may be formed in a same conductive layer forming operation (e.g., at block 210 of the example method 200 of FIGS. 2-3). As shown in FIGS. 13-14, the connecting pattern 615 (or portions thereof) may extend horizontally between the central pattern 111 and the edge pattern 613. This is also illustrated in FIG. 12.

For example, the central pattern 111, connecting pattern 615, and edge pattern 613 (or a first portion 613*a* thereof) may comprise a same thickness (e.g., a vertical thickness in FIGS. 13-14) and/or be made from a same material. Though the central pattern 111, connecting pattern 615, and edge pattern 613 (or a first portion 613*a* thereof) are presented in FIGS. 13-14 in discrete sections for illustrative clarity, where such elements connect, such elements may be formed as a single continuous (or integral) part.

As shown, the edge pattern 613 may be electrically coupled to an interconnection structure 150 by the connecting pattern 615, the central pattern 111, and the conductive via 112. In an example implementation, such interconnection structure 150 (or a plurality of similarly connected interconnection structures 150) may be grounded, for example to enhance the electromagnetic interference protection provided by the edge pattern 613.

Figure 15:
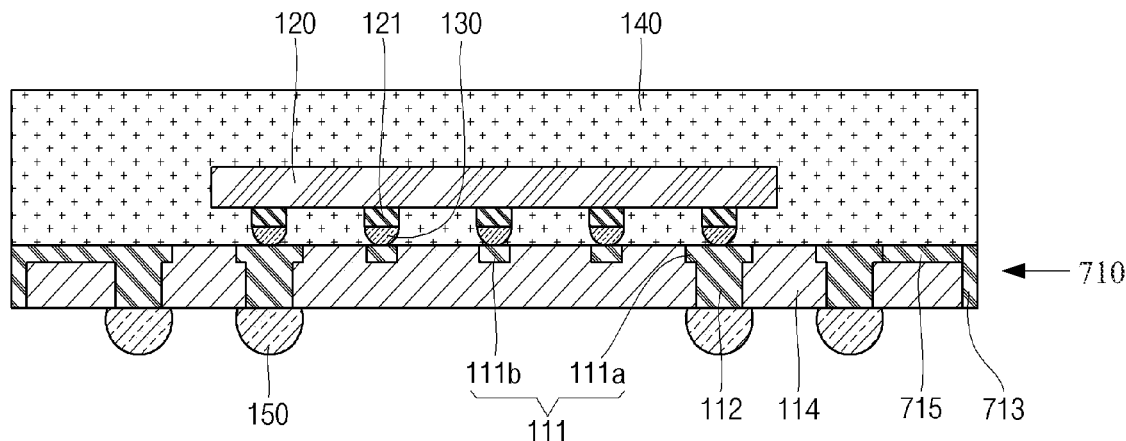
FIG. 15 is a cross-sectional view illustrating an example semiconductor device in accordance with various aspects of the present disclosure.
Figure 16:
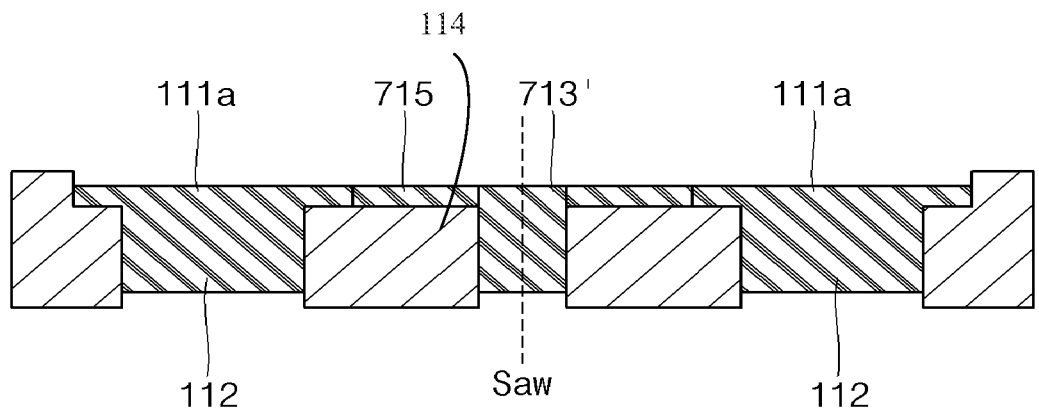
FIG. 16 is a cross-sectional view illustrating various aspects of a method of manufacturing the example semiconductor device of FIG. 15.

A further example implementation is shown in FIGS. 15-16. FIG. 15 is a cross-sectional view illustrating an example semiconductor device in accordance with various aspects of the present disclosure. The example semiconductor device 700 may, for example, share any or all characteristics with the example semiconductor devices 100, 200, 300, 400, 500 and/or 600, shown and discussed herein with regard to FIGS. 1-14. FIG. 16 is a cross-sectional view illustrating various aspects of a method of manufacturing the example semiconductor device 700 of FIG. 15. The example method may, for example, share any or all characteristics with the example method 200 shown and discussed herein with regard to FIGS. 2-3. The following discussion will mainly focus on differences from the other example implementations presented herein. In particular, the following discussion will mainly focus on the differences between the example semiconductor device 700 and the example semiconductor device 300 shown and discussed herein with regard to FIG. 6, and between their respective manufacturing methods.

The example semiconductor device 700 comprises an edge pattern 713. Such edge pattern 713 may, for example, share any or all characteristics with the edge pattern 313 of the example semiconductor device 300 shown and discussed herein with regard to FIGS. 6-7. For example, as with the edge pattern 313, the edge pattern 713 may comprise the remnants of a conductive layer formed in the sawing region 713' after such region is sawn during singulation.

The example semiconductor device 700 also comprises a connecting pattern 715 (or a plurality thereof) that extends between, and electrically connects, the central pattern 111 and the edge pattern 713. In an example implementation, the central pattern 111, connecting pattern 715, and edge pattern 713 (or a first portion thereof) may be formed in a same conductive layer forming operation (e.g., at block 210 of the example method 200 of FIGS. 2-3). As shown in FIGS. 15-16, the connecting pattern 715 (or portions thereof) may extend horizontally between the central pattern 111 and the edge pattern 713. This is also illustrated in FIG. 12.

For example, the central pattern 111, connecting pattern 715, and edge pattern 713 (or a first portion thereof) may comprise a same thickness (e.g., a vertical thickness in FIGS. 15-16) and/or be made from a same material. Though the central pattern 111, connecting pattern 715, and edge pattern 713 (or a first portion thereof) are presented in FIGS. 15-16 in discrete sections for illustrative clarity, where such elements connect, such elements may be formed as a single continuous (or integral) part.

As shown, the edge pattern 713 may be electrically coupled to an interconnection structure 150 by the connecting pattern 715, the central pattern 111, and the conductive via 112. In an example implementation, such interconnection structure 150 (or a plurality of similarly connected interconnection structures 150) may be grounded, for example to enhance the electromagnetic interference protection provided by the edge pattern 713.

Figure 17:
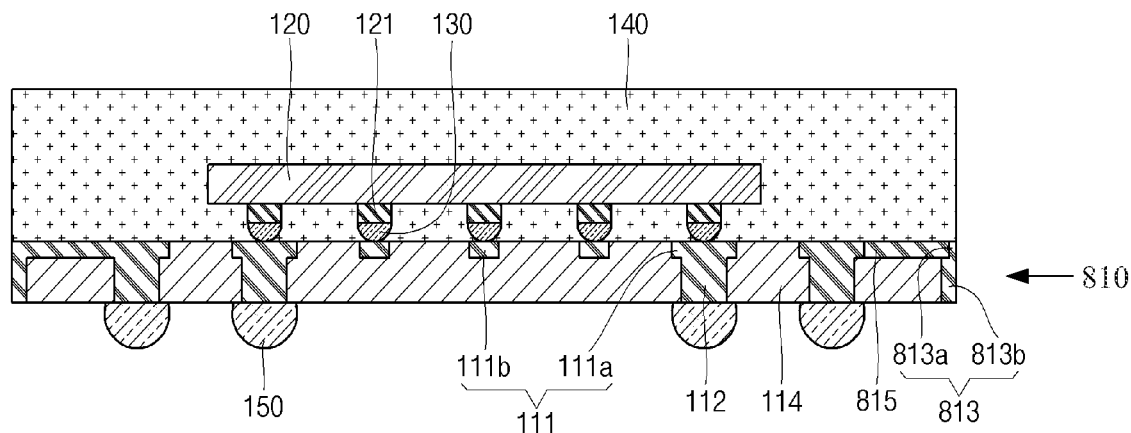
FIG. 17 is a cross-sectional view illustrating an example semiconductor device in accordance with various aspects of the present disclosure.
Figure 18:
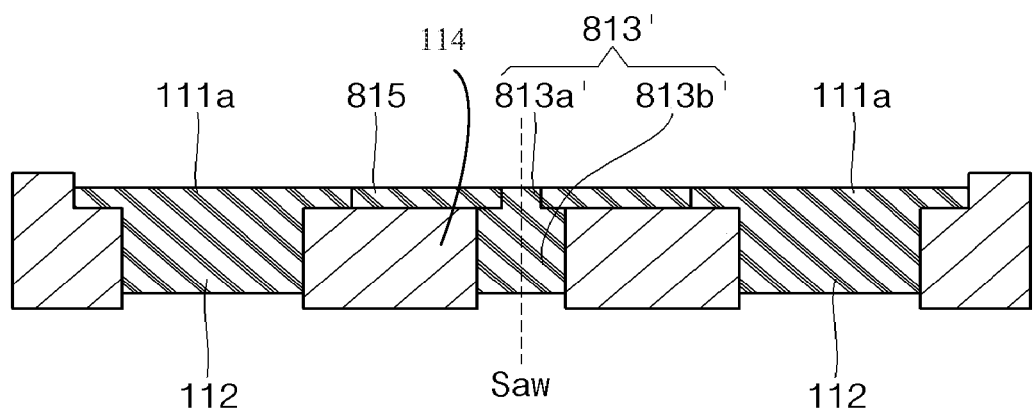
FIG. 18 is a cross-sectional view illustrating various aspects of a method of manufacturing the example semiconductor device of FIG. 17.

Another example implementation is shown in FIGS. 17-18. FIG. 17 is a cross-sectional view illustrating an example semiconductor device in accordance with various aspects of the present disclosure. The example semiconductor device 800 may, for example, share any or all characteristics with the example semiconductor devices 100, 200, 300, 400, 500, 600 and/or 700, shown and discussed herein with regard to FIGS. 1-16. FIG. 18 is a cross-sectional view illustrating various aspects of a method of manufacturing the example semiconductor device 800 of FIG. 17. The example method may, for example, share any or all characteristics with the example method 200 shown and discussed herein with regard to FIGS. 2-3. The following discussion will mainly focus on differences from the other example implementations presented herein. In particular, the following discussion will mainly focus on the differences between the example semiconductor device 800 and the example semiconductor device 400 shown and discussed herein with regard to FIG. 8, and between their respective manufacturing methods.

The example semiconductor device 800 comprises an edge pattern 813. Such edge pattern 713 may, for example, share any or all characteristics with the edge pattern 413 of the example semiconductor device 400 shown and discussed herein with regard to FIGS. 8-9. For example, as with the edge pattern 413, the edge pattern 813 may comprise the remnants of a conductive layer formed in the sawing region 813' (as shown in FIG. 18) after such region is sawn during singulation.

The example semiconductor device 800 also comprises a connecting pattern 815 (or a plurality thereof) that extends between, and electrically connects, the central pattern 111 and the edge pattern 813. In an example implementation, the central pattern 111, connecting pattern 815, and edge pattern 813 (or a first portion 813a thereof) may be formed in a same conductive layer forming operation (e.g., at block 210 of the example method 200 of FIGS. 2-3). As shown in FIGS. 17-18, the connecting pattern 815 (or portions thereof) may extend horizontally between the central pattern 111 and the edge pattern 813. This is also illustrated in FIG. 12.

For example, the central pattern 111, connecting pattern 815, and edge pattern 813 (or a first portion 813a thereof) may comprise a same thickness (e.g., a vertical thickness in FIGS. 17-18) and/or be made from a same material. Though the central pattern 111, connecting pattern 815, and edge pattern 813 (or a first portion 813a thereof) are presented in FIGS. 17-18 in discrete sections for illustrative clarity, where such elements connect, such elements may be formed as a single continuous (or integral) part.

As shown, the edge pattern 813 may be electrically coupled to an interconnection structure 150 by the connecting pattern 815, the central pattern 111, and the conductive via 112. In an example implementation, such interconnection structure 150 (or a plurality of similarly connected interconnection structures 150) may be grounded, for example to enhance the electromagnetic interference protection provided by the edge pattern 813.

In summary, various aspects of this disclosure provide a thin semiconductor device with enhanced edge protection, and a method of manufacturing thereof. For example and without limitation, various aspects of this disclosure provide a thin semiconductor device comprising a substrate with an edge-protection region, and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device, comprising:
    a substrate comprising a substrate top side, a substrate bottom side, substrate lateral sides defining a perimeter of the substrate, a conductive structure at the perimeter of the substrate, and a mold material providing a portion of the substrate top side and a portion of the substrate bottom side;
    a semiconductor die coupled to the substrate top side; and
    an encapsulant that encapsulates the semiconductor die and contacts the mold material at the substrate top side;
    wherein the conductive structure comprises an upper portion and a lower portion adjoining the upper portion;
    wherein the upper portion of the conductive structure comprises an upper portion bottom side, an upper portion top side providing a portion of the substrate top side, and an upper portion lateral side exposed at the perimeter of the substrate;
    wherein the lower portion of the conductive structure comprises a lower portion bottom side providing a portion of the substrate bottom side and a lower portion lateral side exposed at the perimeter of the substrate;
    wherein the upper portion of the conductive structure is wider than the lower portion of the conductive structure;
    wherein the mold material of the substrate contacts the upper portion bottom side; and
    wherein the upper portion top side of the conductive structure is recessed in the mold material such that the upper portion top side is lower than an adjacent portion of the substrate top side provided by the mold material.

2. The semiconductor device of claim 1, wherein the upper portion bottom side of the conductive structure adjoins a lower portion top side of the conductive structure.

3. The semiconductor device of claim 1, wherein:
    the substrate comprises a conductive pattern at the substrate top side; and
    the semiconductor die is coupled to the conductive pattern.

4. The semiconductor device of claim 3, wherein the conductive pattern is coupled to the conductive structure.

5. The semiconductor device of claim 3, wherein the conductive pattern is isolated from the conductive structure.

6. The semiconductor device of claim 1, wherein a thickness of the lower portion of the conductive structure is greater than a thickness of the upper portion of the conductive structure.

7. The semiconductor device of claim 1, wherein:
    the encapsulant covers a lateral side of the semiconductor die and covers a top side of the semiconductor die; and
    a lateral side of the encapsulant is coplanar with at least one of the substrate lateral sides.

8. The semiconductor device of claim 1, wherein the upper portion of the conductive structure and the lower portion of the conductive structure are a same metal.

9. The semiconductor device of claim 1, wherein the lower portion bottom side of the conductive structure is recessed in the mold material such that the lower portion bottom side is higher than an adjacent portion of the substrate bottom side provided by the mold material.

10. A semiconductor device, comprising:
    a substrate comprising a substrate top side, a substrate bottom side, and substrate lateral sides defining a perimeter of the substrate;
    a semiconductor die coupled to the substrate top side; and
    an encapsulant that encapsulates the semiconductor die;
    wherein the perimeter of the substrate comprises a conductive structure;
    wherein an upper portion of the conductive structure comprises an upper portion bottom side, an upper portion top side exposed at the substrate top side, and an upper portion lateral side exposed at a first substrate lateral side of the substrate lateral sides;
    wherein a lower portion of the conductive structure adjoins the upper portion of the conductive structure and comprises a lower portion bottom side exposed at the substrate bottom side and a lower portion lateral side exposed at the first substrate lateral side;
    wherein the upper portion of the conductive structure is wider than the lower portion of the conductive structure;

wherein a mold material of the substrate contacts the upper portion bottom side of the conductive structure and contacts the encapsulant; and wherein the upper portion top side of the conductive structure is recessed in the mold material such that the upper portion top side is lower than an adjacent portion of the substrate top side provided by the mold material.

11. The semiconductor device of claim 10, wherein the upper portion bottom side of the conductive structure adjoins a lower portion top side of the conductive structure.

12. The semiconductor device of claim 10, wherein:

the substrate comprises a conductive pattern at the substrate top side; and the semiconductor die is coupled to the conductive pattern.

13. The semiconductor device of claim 12, wherein the conductive pattern is coupled to the conductive structure.

14. The semiconductor device of claim 12, wherein the conductive pattern is isolated from the conductive structure.

15. The semiconductor device of claim 10, wherein a thickness of the lower portion of the conductive structure is greater than a thickness of the upper portion of the conductive structure.

16. The semiconductor device of claim 10, wherein the encapsulant covers a lateral side of the semiconductor die and covers a top side of the semiconductor die.

17. The semiconductor device of claim 10, wherein the upper portion of the conductive structure and the lower portion of the conductive structure are a same metal.

18. The semiconductor device of claim 10, wherein the lower portion bottom side of the conductive structure is recessed in the mold material such that the lower portion bottom side is higher than an adjacent portion of the substrate bottom side provided by the mold material.

19. A method, comprising:

providing a substrate comprising a substrate top side, a substrate bottom side, substrate lateral sides defining a perimeter of the substrate, a conductive structure at the perimeter of the substrate, and a mold material providing a portion of the substrate top side and a portion of the substrate bottom side;

providing a semiconductor die coupled to the substrate top side; and providing an encapsulant that encapsulates the semiconductor die and contacts the mold material at the substrate top side;

wherein the conductive structure comprises an upper portion and a lower portion adjoining the upper portion;

wherein the upper portion of the conductive structure comprises an upper portion bottom side, an upper portion top side providing a portion of the substrate top side, and an upper portion lateral side exposed at the perimeter of the substrate;

wherein the lower portion of the conductive structure comprises a lower portion bottom side providing a portion of the substrate bottom side and a lower portion lateral side exposed at the perimeter of the substrate;

wherein the upper portion of the conductive structure is wider than the lower portion of the conductive structure;

wherein the mold material of the substrate contacts the upper portion bottom side; and wherein the upper portion top side of the conductive structure is recessed in the mold material such that the upper portion top side is lower than an adjacent portion of the substrate top side provided by the mold material.

20. The method of claim 19, comprising singulating along a singulation line to form a substrate lateral side of the substrate lateral sides, wherein the singulating includes singulating through the conductive structure of the substrate.

* * * * *